US008970515B2

(12) United States Patent
Moran et al.

(10) Patent No.: US 8,970,515 B2
(45) Date of Patent: Mar. 3, 2015

(54) TOUCH SCREEN SENSOR AND PATTERNED SUBSTRATE HAVING OVERLAID MICROPATTERNS WITH LOW VISIBILITY

(75) Inventors: Cristin E. Moran, St. Paul, MN (US); Matthew H. Frey, Cottage Grove, MN (US); Brian L. Linzie, Stillwater, MN (US); Billy L. Weaver, Eagan, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 629 days.

(21) Appl. No.: 13/148,369

(22) PCT Filed: Feb. 24, 2010

(86) PCT No.: PCT/US2010/025127
§ 371 (c)(1),
(2), (4) Date: Aug. 8, 2011

(87) PCT Pub. No.: WO2010/099132
PCT Pub. Date: Sep. 2, 2010

(65) Prior Publication Data
US 2011/0310037 A1  Dec. 22, 2011

Related U.S. Application Data

(63) Continuation-in-part of application No. PCT/US2009/035250, filed on Feb. 26, 2009.

(60) Provisional application No. 61/237,673, filed on Aug. 27, 2009.

(51) Int. Cl.
G06F 3/041 (2006.01)
G06F 3/044 (2006.01)
G06F 3/045 (2006.01)

(52) U.S. Cl.
CPC .............. *G06F 3/0412* (2013.01); *G06F 3/044* (2013.01); *G06F 3/045* (2013.01); *G06F 2203/04112* (2013.01)
USPC .......................................................... 345/173

(58) Field of Classification Search
CPC ............ G06F 3/041–3/047; G06F 2203/04112
USPC .................................................. 345/173–183
See application file for complete search history.

(56) References Cited

U.S. PATENT DOCUMENTS

| 4,087,625 A | 5/1978 | Dym |
| 5,126,007 A | 6/1992 | Shmulovich |

(Continued)

FOREIGN PATENT DOCUMENTS

| EP | 0911906 | 4/1999 |
| EP | 1 195 991 | 4/2002 |

(Continued)

OTHER PUBLICATIONS

Watson et al., "A standard model for foveal detection of spatial contrast" Journal of Vision (2005) 5, 717-740.

(Continued)

*Primary Examiner* — Dorothy Harris
(74) *Attorney, Agent, or Firm* — Adrian L. Pishko; Carolyn A. Fischer

(57) ABSTRACT

Presently described are articles such as antennas, EMI shields, and touch screen sensors as well as patterned substrates having overlaid micropatterns with low visibility. Also described are methods of determining the visibility of a patterned substrate. In one embodiment, a patterned substrate is described comprising a visible light transparent substrate; and at least two overlaid electrically conductive mesh micropatterns, wherein each mesh has a repeating cell geometry and the combination of overlaid micropatterns has a spatial contrast threshold at a distance of 30000 units of greater than −35 decibels.

17 Claims, 24 Drawing Sheets

(56) References Cited

U.S. PATENT DOCUMENTS

| | | | |
|---|---|---|---|
| 5,386,219 | A | 1/1995 | Greanias |
| 5,492,611 | A | 2/1996 | Sugama |
| 5,640,258 | A * | 6/1997 | Kurashima et al. ............. 349/23 |
| 6,297,811 | B1 | 10/2001 | Kent |
| 6,674,492 | B1 * | 1/2004 | Kogame et al. ................. 349/10 |
| 6,775,907 | B1 | 8/2004 | Boyko |
| 6,798,464 | B2 | 9/2004 | Bietsch |
| 7,992,035 | B2 | 8/2011 | Daikokuya |
| 8,013,943 | B2 | 9/2011 | Tanaka |
| 2002/0050783 | A1 | 5/2002 | Kubota |
| 2002/0130605 | A1 | 9/2002 | Mueller |
| 2004/0183788 | A1 | 9/2004 | Kurashima |
| 2004/0239650 | A1 * | 12/2004 | Mackey ......................... 345/174 |
| 2007/0236618 | A1 * | 10/2007 | Maag et al. ..................... 349/12 |
| 2007/0248799 | A1 * | 10/2007 | DeAngelis et al. ............ 428/209 |
| 2008/0150905 | A1 * | 6/2008 | Grivna et al. ................. 345/173 |
| 2008/0303798 | A1 | 12/2008 | Matsudate |
| 2009/0046077 | A1 | 2/2009 | Tanaka |
| 2009/0104572 | A1 * | 4/2009 | Gao et al. ...................... 430/348 |
| 2009/0218310 | A1 | 9/2009 | Zu |
| 2009/0219257 | A1 | 9/2009 | Frey |
| 2009/0219258 | A1 | 9/2009 | Geaghan |
| 2010/0026664 | A1 | 2/2010 | Geaghan |
| 2010/0045615 | A1 * | 2/2010 | Gray et al. .................... 345/173 |
| 2010/0123670 | A1 * | 5/2010 | Philipp ......................... 345/173 |
| 2010/0156840 | A1 | 6/2010 | Frey |
| 2011/0226733 | A1 | 9/2011 | Zu |
| 2011/0291966 | A1 | 12/2011 | Takao |
| 2012/0194441 | A1 * | 8/2012 | Frey .............................. 345/173 |

FOREIGN PATENT DOCUMENTS

| | | |
|---|---|---|
| EP | 1 850 649 | 10/2007 |
| JP | 10-312715 | 11/1998 |
| JP | 11-110115 | 4/1999 |
| JP | 11-266095 | 9/1999 |
| JP | 11-307988 | 11/1999 |
| JP | 11-330772 | 11/1999 |
| JP | 11-330774 | 11/1999 |
| JP | 2000-066614 | 3/2000 |
| JP | 2000-223036 | 8/2000 |
| JP | 2004-192093 | 7/2004 |
| JP | 2006-344163 | 12/2006 |
| JP | 2006344163 A * | 12/2006 |
| JP | 2007-156371 | 6/2007 |
| JP | 2007-227906 | 9/2007 |
| JP | 2007-310091 | 11/2007 |
| JP | 2008-034501 | 2/2008 |
| JP | 2008-055721 | 3/2008 |
| JP | 2008-187039 | 8/2008 |
| WO | WO 2005/121940 | 12/2005 |
| WO | WO 2008/140007 | 11/2008 |
| WO | WO 2010/151471 | 12/2010 |
| WO | WO 2011/002617 | 1/2011 |

OTHER PUBLICATIONS

International Search Report PCT/US2010/025127 Mar. 17, 2011, 7 pgs.

* cited by examiner

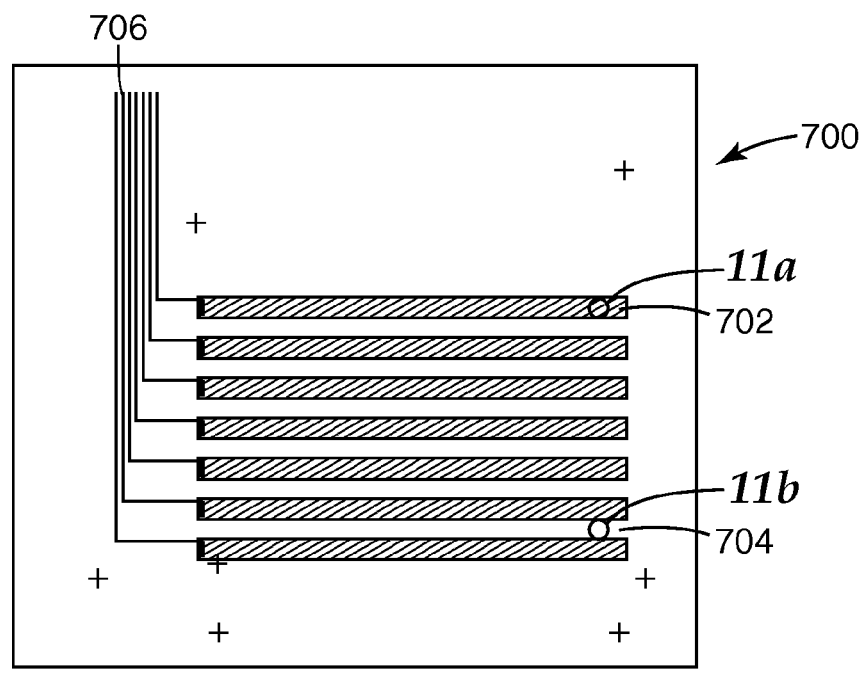
*Fig. 11*
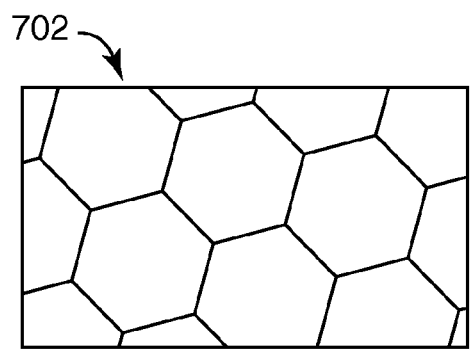 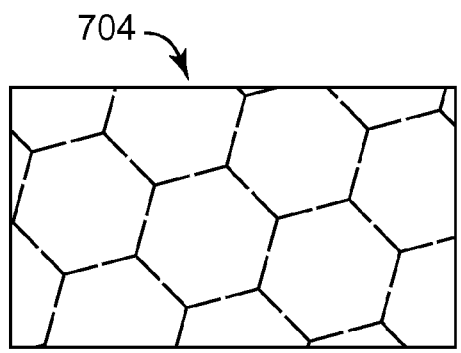
*Fig. 11a*    *Fig. 11b*

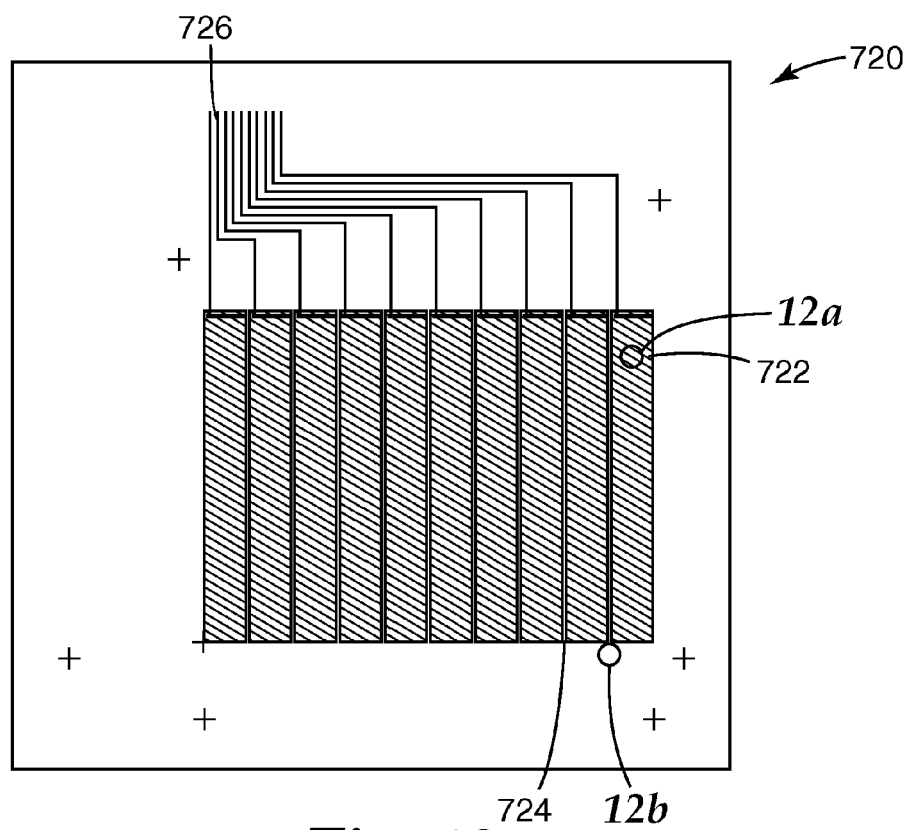
Fig. 12
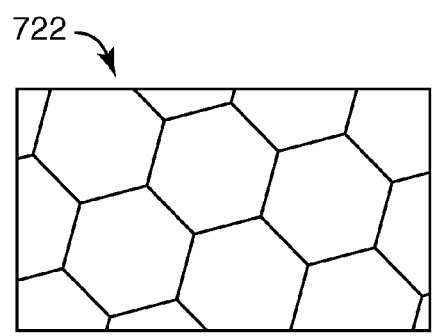 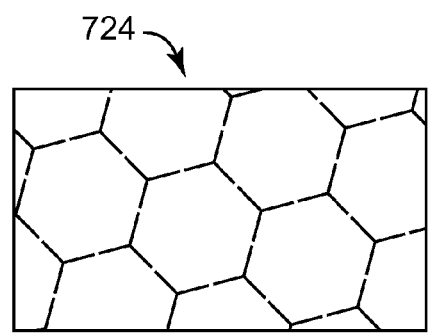
Fig. 12a  Fig. 12b

SAMPLE 1

SAMPLE 2

SAMPLE 3

SAMPLE 4

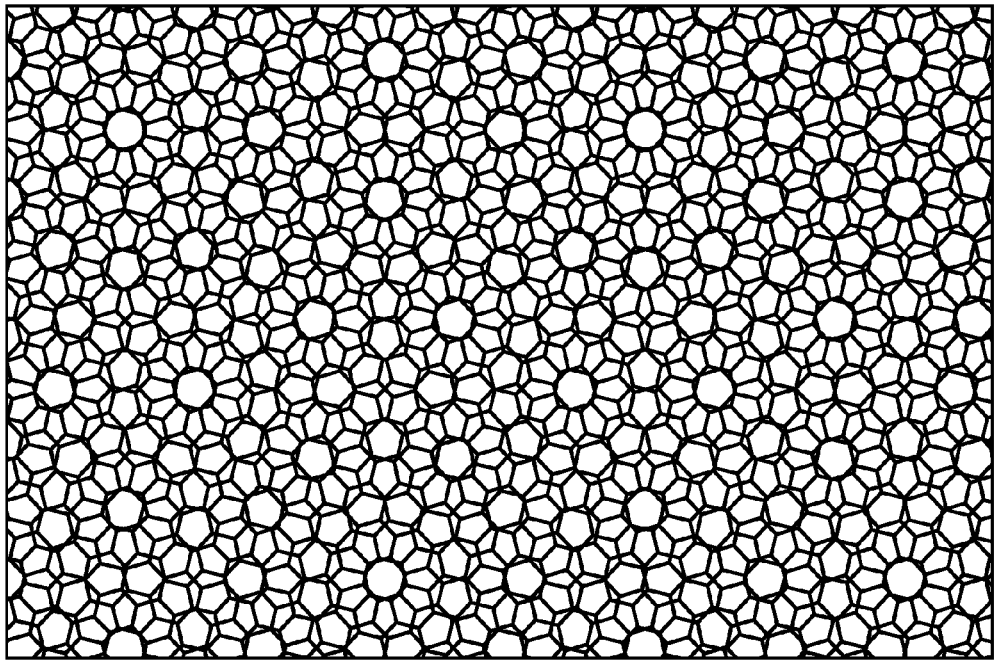
SAMPLE 6      *Fig. 18*
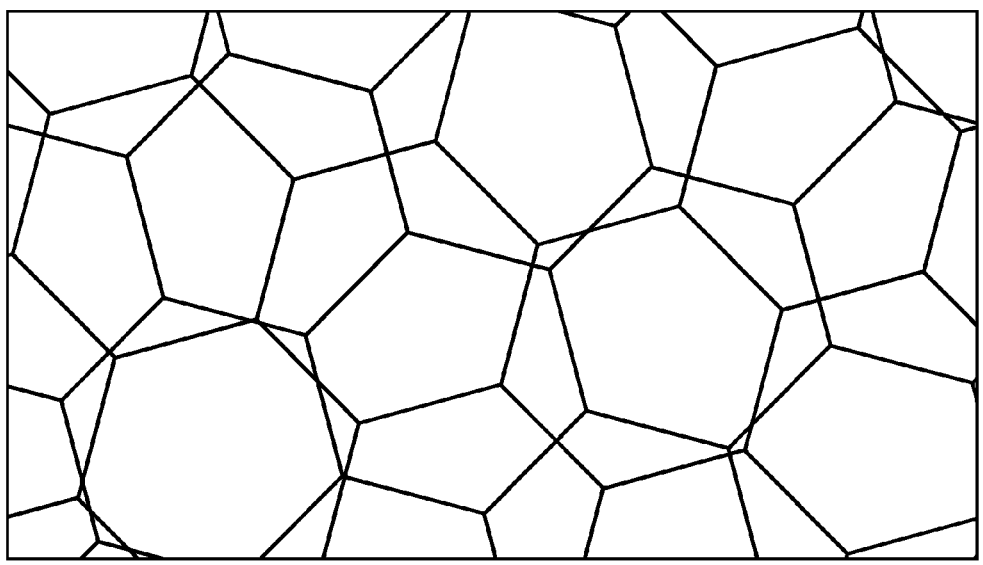
SAMPLE 7      *Fig. 19*

SAMPLE 10

SAMPLE 11

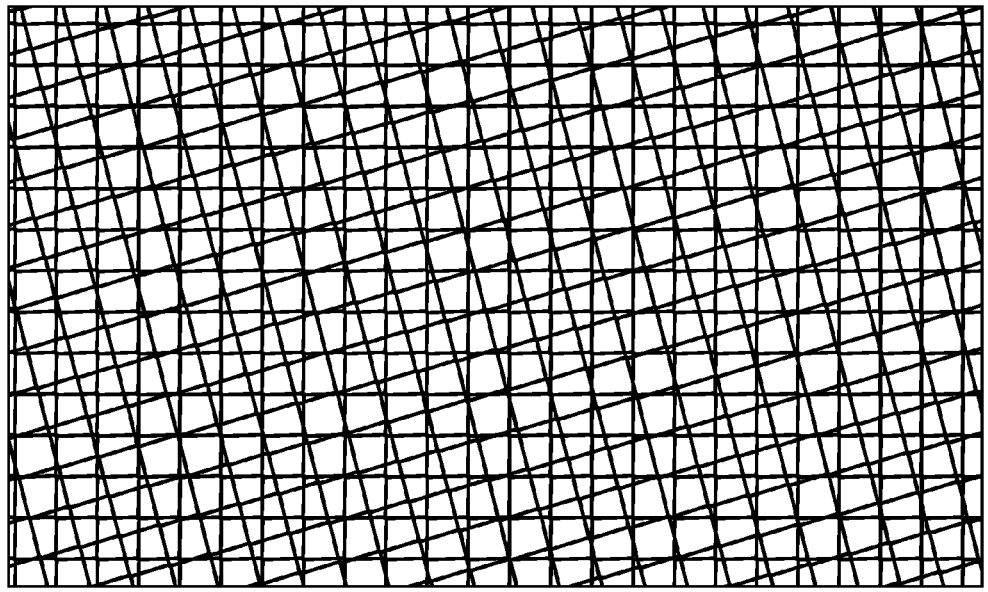
SAMPLE 12            *Fig. 22*
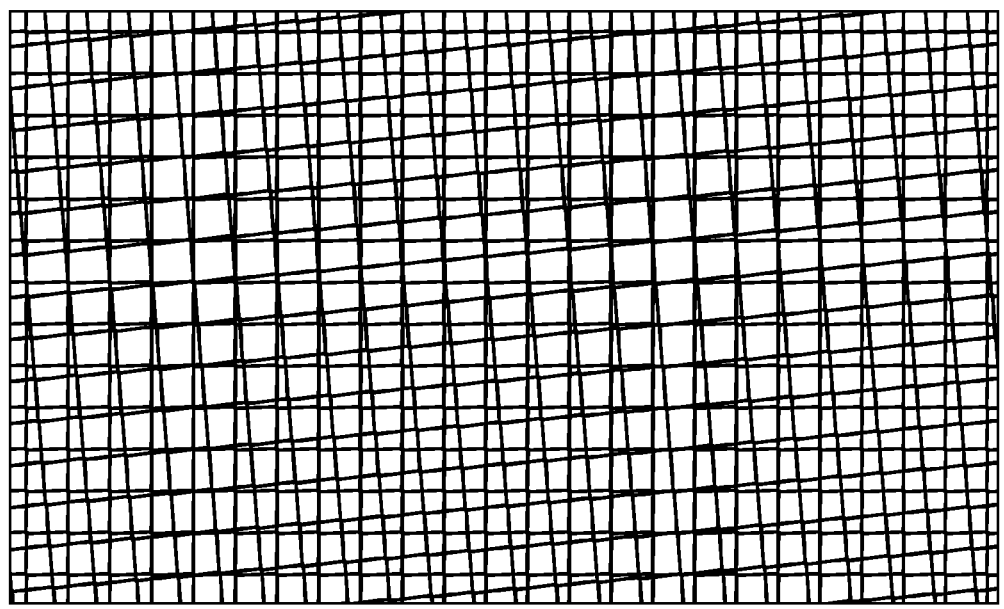
SAMPLE 13            *Fig. 23*

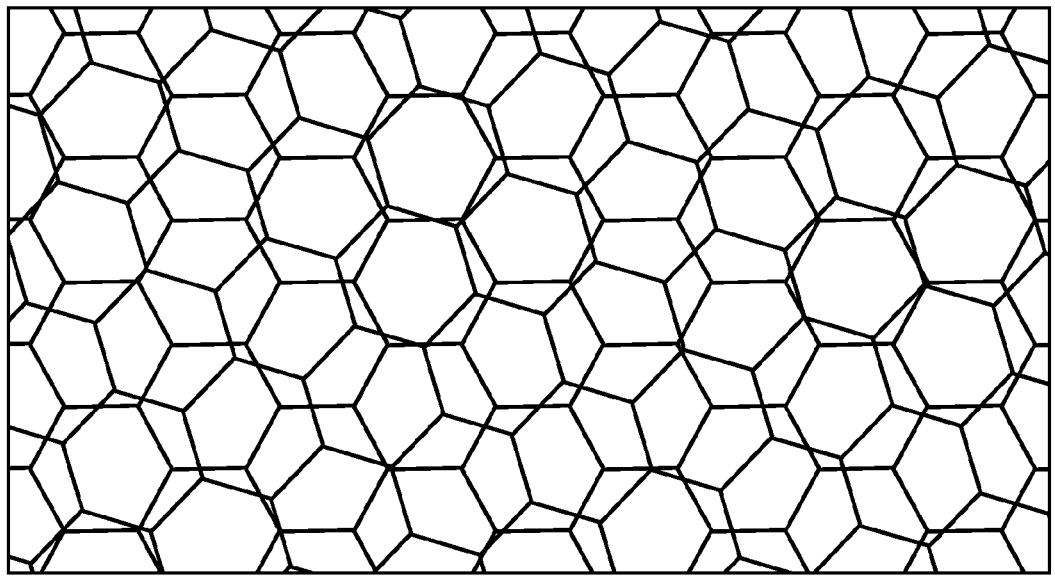
SAMPLE 14      *Fig. 24*
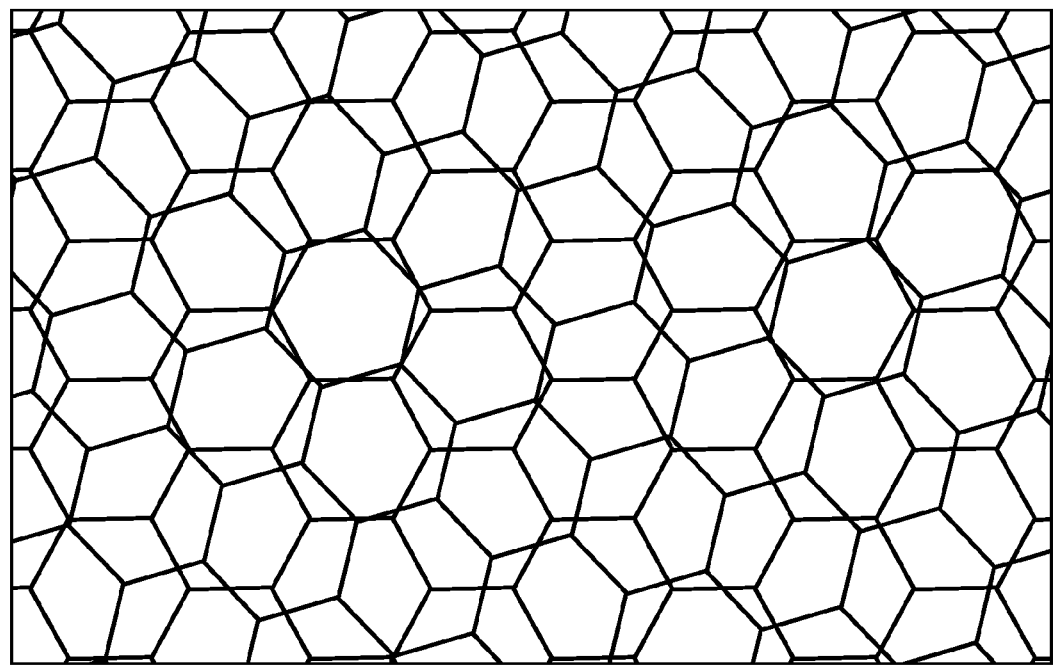
SAMPLE 15      *Fig. 25*

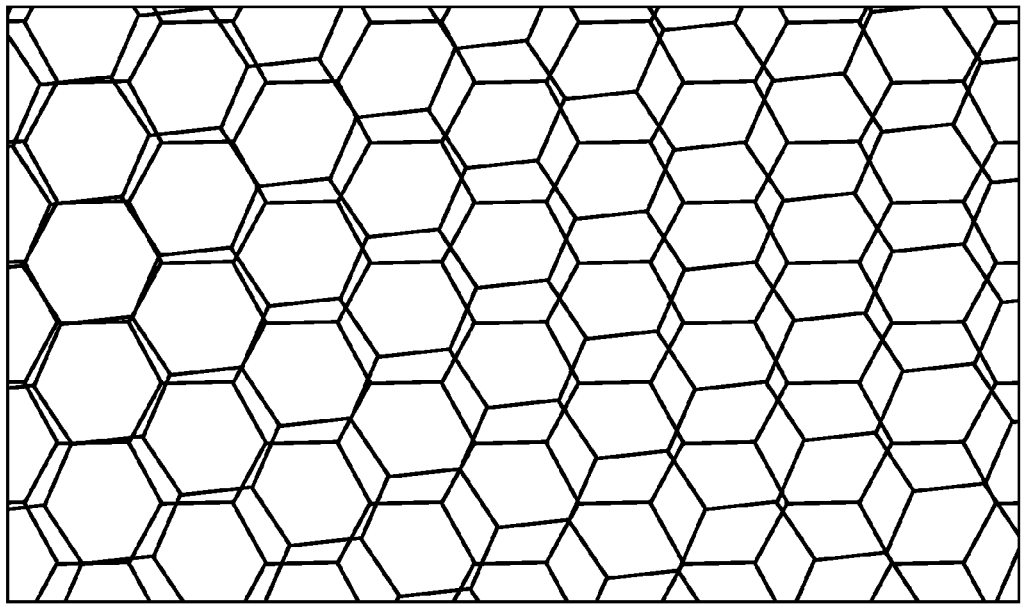
SAMPLE 16  *Fig. 26*
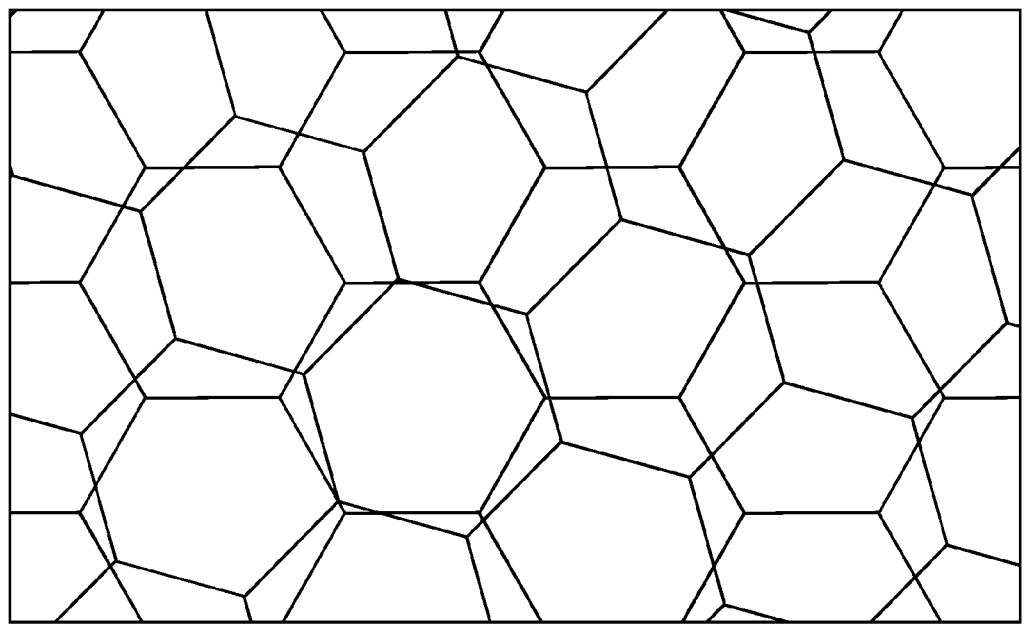
SAMPLE 17  *Fig. 27*

SAMPLE 18

SAMPLE 19

SAMPLE 20

SAMPLE 21

SAMPLE 22

SAMPLE 23

SAMPLE 24

SAMPLE 25

COMPARATIVE EXAMPLE A

TOUCH SCREEN SENSOR AND PATTERNED SUBSTRATE HAVING OVERLAID MICROPATTERNS WITH LOW VISIBILITY

CROSS REFERENCE TO RELATED APPLICATIONS

This application is a national stage filing under 35 U.S.C. 371 of PCT/US2010/025127, filed Feb. 24, 2010, which claims priority to U.S. Provisional Application No. 61/237,673, filed Aug. 27, 2009, and this application is a continuation-in-part of PCT/US2009/035250, filed Feb. 26, 2009, the disclosures of which are incorporated by reference in their entirety herein.

BACKGROUND

Touch screen sensors detect the location of an object (e.g. a finger or a stylus) applied to the surface of a touch screen display or the location of an object positioned near the surface of a touch screen display. These sensors detect the location of the object along the surface of the display, e.g. in the plane of a flat rectangular display. Examples of touch screen sensors include capacitive sensors, resistive sensors, and projected capacitive sensors. Such sensors include transparent conductive elements that overlay the display. The elements are combined with electronic components that use electrical signals to probe the elements in order to determine the location of an object near or in contact with the display.

Other components that can overlay a display and that include transparent conductive elements include electromagnetic interference (EMI) shields and antennas.

SUMMARY

It has been found that while a single conductive (e.g. mesh) micropattern on a transparent (e.g. plastic film) substrate can be virtually undetectable to an unaided human eye of normal (20/20) vision, the placement of a second conductive (e.g. mesh) micropattern overlaying the first micropattern can result in the combination of micropatterns (i.e. the composite pattern) being highly visible.

In some embodiments, articles such as antennas, EMI shields, and especially touch screen sensors are described. The articles comprise a visible light transparent substrate; a first conductive micropattern comprising linear traces defining a first open mesh of a repeating cell geometry disposed on or in the visible light transparent substrate, and a second conductive micropattern comprising linear traces defining a second open mesh of a repeating cell geometry electrically isolated from the first conductive micropattern. The first conductive micropattern and the second conductive micropattern are overlaid.

In yet other embodiments, methods of determining the visibility of a patterned substrate are described. The methods comprise providing a digital image of a micropatterned substrate; and calculating the spatial contrast threshold from the digital image by use of a mathematical model for foveal detection. Such method can be useful for evaluating and designing micropatterns and micropatterned substrates having a particular (e.g. low) visibility without fabricating a physical sample.

In yet another embodiment, a patterned substrate is described comprising a visible light transparent substrate; and at least two overlaid electrically conductive mesh micropatterns, wherein each mesh has a repeating cell geometry and the combination of overlaid micropatterns has a spatial contrast threshold at a distance of 30000 units of greater than −35 decibels.

In each of these embodied articles and patterned substrates, the overlaid micropatterns can exhibit low visibility by virtue of the design and arrangement of the first and second micropatterns relative to each other.

In one embodiment, the second conductive micropattern overlays the first conductive micropattern such that at least a portion of the linear traces of the second conductive micropattern are non-parallel to the linear traces of first conductive micropattern. In another embodiment, at least a portion of the second conductive micropattern has a different cell geometry from the cell geometry of the first conductive micropattern. In another embodiment, at least a portion of the second conductive micropattern has a different cell dimension from the cell dimension of the first conductive micropattern. Further, the design and arrangement of the first and second micropattern may result in the overlaid micropatterns having two or more of these attributes.

In some favored embodiments, the first and second conductive micropattern have the same geometry such as a (e.g. regular) hexagonal cell geometry. The second micropattern may be orientated at a bias angle ranging from about 15 degrees to about 40 degrees relative to the first micropattern. The first and second conductive micropattern may differ in cell dimension by a ratio up to 1:6. The linear traces preferably have a line width of less than 10 microns, and more preferably less than 5 microns. The cell dimension of the first and second micropattern is preferably no greater than 500 microns.

BRIEF DESCRIPTION OF THE DRAWINGS

The invention may be more completely understood in consideration of the following detailed description of various embodiments of the invention in connection with the accompanying drawings, in which:

FIGS. 11, 11a, and 11b illustrate various portions of a first patterned substrate;

FIGS. 12, 12a, and 12b illustrate various portions of a second patterned substrate;

FIGS. 14-36 depict magnified illustrations of an area of approximately 1.5 mm by 2.5 mm of the overlaid micropatterns samples. Such overlaid pattern portions are smaller than the sample size used for determining the contrast threshold. Except for the optical micrographs of FIGS. 6 and 7, the figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
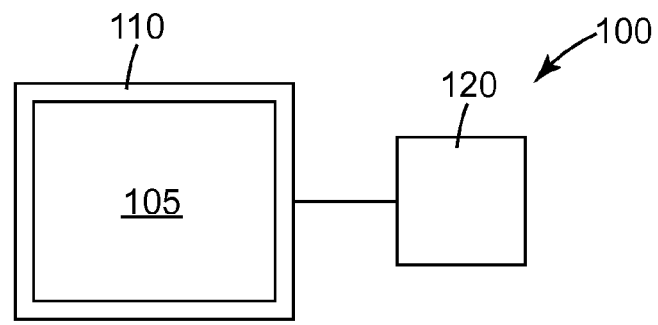
FIG. 1 illustrates a schematic diagram of a touch screen sensor 100.

Presently described are touch screen sensors and micropatterned substrates that comprise a visible light transparent substrate and at least two electrically conductive micropatterns disposed on or in the visible light transparent substrate. In some embodiments, each electrically conductive micropattern is disposed on or in separate visible light transparent substrates. In other embodiments, the at least two electrically conductive micropattern are disposed on or in a single visible light transparent substrate such that the conductive patterns are electrically isolated. The micropatterns are overlaid and can exhibit low visibility by virtue of the design and arrangement of the first and second patterns relative to each other.

As used herein "micropattern" refers to an arrangement of dots, lines, filled shapes, or a combination thereof having a dimension (e.g. line width) of no greater than 1 mm. In preferred embodiments, the arrangement of dots, lines, filled shapes, or a combination thereof have a dimension (e.g. line width) of at least 0.5 microns and typically no greater than 20 microns. The dimension of the micropattern features can vary depending on the micropattern selection. In some favored embodiments, the micropattern feature dimension (e.g. line width) is less than 10, 9, 8, 7, 6, or 5 micrometers (e.g. 1-3 micrometers).

As used herein, "visible light transparent" refers to the level of transmission of the unpatterned substrate or article comprising the micropatterned substrate being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or lines with minimum dimension, e.g. width, between 0.5 and 10 micrometers, or between 1 and 5 micrometers) that block light locally to less than 80 percent transmission (e.g., 0 percent); however, in such cases, for an approximately equiaxed area including the microscopic feature and measuring 1000 times the minimum dimension of the microscopic feature in width, the average transmittance is greater than 60 percent. The term "visible" in connection with "visible light transparent" is modifying the term "light," so as to specify the wavelength range of light for which the substrate or micropatterned article is transparent.

Common visible light transparent substrates include glass and polymeric films. A polymeric "film" substrate is a polymer material in the form of a flat sheet that is sufficiently flexible and strong to be processed in a roll-to-roll fashion. By roll-to-roll, what is meant is a process where material is wound onto or unwound from a support, as well as further processed in some way. Examples of further processes include coating, slitting, blanking, and exposing to radiation, or the like. Polymeric films can be manufactured in a variety of thicknesses, ranging in general from about 5 µm to 1000 µm. In many embodiments, polymeric film thicknesses range from about 25 µm to about 500 µm, or from about 50 µm to about 250 µm, or from about 75 µm to about 200 µm. Roll-to-roll polymeric films may have a width of at least 12 inches, 24 inches, 36 inches, or 48 inches.

Presently described are overlaid conductive micropatterns that can be integrated directly with materials or components of a display. For example, one or more overlaid conductive micropatterns may be deposited onto the color filter glass layer of a liquid crystal display. As another example, one or more overlaid conductive micropatterns may be deposited onto the exit polarizing film or compensation film of a liquid crystal display (LCD). As another example, one or more overlaid conductive micropatterns may be deposited onto a substrate that is in contact with electrophoretic media in a reflective electrophoretic (EP) display. As another example, one or more overlaid conductive micropatterns may be deposited onto a glass or plastic substrate that supports material layers of an organic light emitting diode (OLED) display. Some of such implementations of the conductive micropatterns may be described as "on-cell."

The disclosure further relates to contact or proximity sensors for touch input of information or instructions into electronic devices (e.g., computers, cellular telephones, etc.) These sensors are visible light transparent and useful in direct combination with a display, overlaying a display element, and interfaced with a device that drives the display (as a "touch screen" sensor). The sensor element has a sheet like form and includes at least one electrically insulating visible light transparent substrate layer that supports a conductive material (e.g., metal) that is patterned onto the surface of the substrate in a mesh geometry so as to generate a transparent conductive region that lies within the touch sensing area of the sensor. However, the first and second conductive micropattern may have other arrangements provided that the second conductive micropattern (e.g. orthogonal to the first) is electrically isolated from the first conductive micropattern. For example, an insulating component can be provided at the intersections between the first and second conductive micropatterns, as known in the art. It is within the scope of two conductive micropatterns that are electrically isolated for the micropatterns both to be connected to the same signal processing, logic, memory, or other circuitry for the purpose of using the micropatterns as part of a system (e.g., driving the conductive micropatterns with electrical signals for the purpose of capacitively detecting the presence or location of a touch event to an information display). To be electrically isolated, the micropatterns need only be lacking electrical contact in an overlapping or overlaid region, by means of an insulating space (e.g., air, dielectric material) between them.

In the case of touch sensors comprising the conductive micropatterns, at least a portion of the metal micropattern is contiguous and in electrical connection with circuitry of an electronic illuminated display.

The sensing area of a touch sensor for an information display is that region of the sensor that is intended to overlay, or that overlays, a viewable portion of the information display and is visible light transparent in order to allow viewability of the information display. Viewable portion of the information display refers to that portion of an information display that has changeable information content, e.g. the portion of a display "screen" that is occupied by pixels, e.g. the pixels of a liquid crystal display.

The touch screen sensors may be for example a resistive, capacitive, and projected capacitive types. The visible light transparent conductor micropatterns are particularly useful for projected capacitive touch screen sensors that are integrated with electronic displays. As a component of (e.g. projected capacitive) touch screen sensors, the visible light transparent conductive micropattern are useful for enabling high touch sensitivity, multi-touch detection, and stylus input.

While the present invention is not so limited, an appreciation of various aspects of the invention will be gained through a discussion of the examples provided below.

FIG. 1 illustrates a schematic diagram of a touch screen sensor 100. The touch screen sensor 100 includes a touch screen panel 110 having a touch sensing area 105. The touch sensing area 105 is electrically coupled to a touch sensor drive device 120. The touch screen panel 110 is incorporated into a display device.

Figure 2:
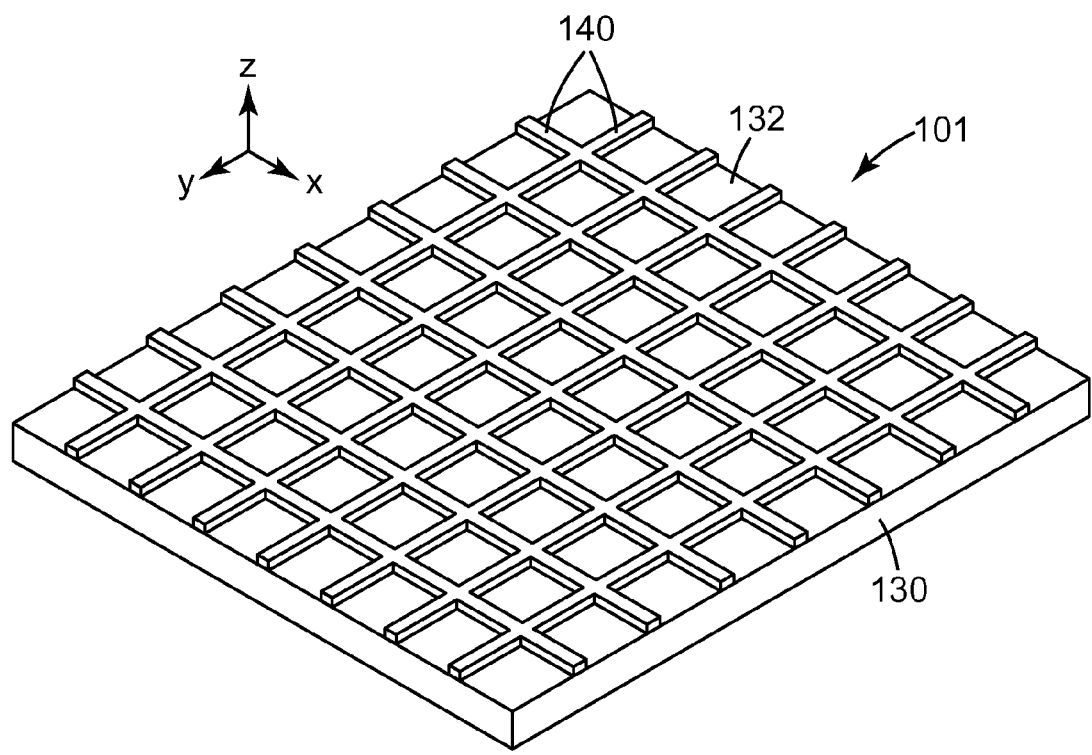
FIG. 2 illustrates a perspective view of a conductive visible light transparent region lying within a touch screen sensing area.

FIG. 2 illustrates a perspective view of a conductive visible light transparent region 101 that would lie within a touch sensing area of a touch screen panel, e.g., touch sensing area 105 in FIG. 1. The conductive visible light transparent region 101 includes a visible light transparent substrate 130 and an electrically conductive micropattern 140 disposed on or in the visible light transparent substrate 130. The visible light transparent substrate 130 includes a major surface 132 and is electrically insulating. The visible light transparent substrate 130 can be formed of any useful electrically insulating material such as, e.g., glass or polymer. Examples of useful polymers for light transparent substrate 130 include polyethylene terephthalate (PET), polycarbonate (PC), polycarbonate copolymers, and polyethylene naphthalate (PEN). The electrically conductive micropattern 140 can be formed of a plurality of linear metallic features.

FIG. 2 also illustrates an axis system for use in describing the conductive visible light transparent region 101 that would lie within a touch sensing area of a touch screen panel. Generally, for display devices, the x and y axes correspond to the width and length of the display and the z axis is typically along the thickness (i.e., height) direction of a display. This convention will be used throughout, unless otherwise stated. In the axis system of FIG. 2, the x axis and y axis are defined to be parallel to a major surface 132 of the visible light transparent substrate 130 and may correspond to width and length directions of a square or rectangular surface. The z axis is perpendicular to that major surface and is typically along the thickness direction of the visible light transparent substrate 130. A width of the plurality of linear metallic features that form the electrically conductive micropattern 140 correspond to an x-direction distance for the parallel linear metallic features that extend linearly along the y axis and a y-direction distance for the orthogonal linear metallic features correspond to a width of the orthogonal linear metallic features. A thickness or height of the linear metallic features corresponds to a z-direction distance.

In the illustrated embodiment, the conductive visible light transparent region 101 that lies within a touch sensing area of a touch screen panel includes two or more layers of visible light transparent substrate 130 each having a conductive micropattern 140.

The conductive micropattern 140 is deposited on the major surface 132. Because the sensor is to be interfaced with a display to form a touch screen display, or touch panel display, the substrate 130 is visible light transparent and substantially planar. The substrate and the sensor may be substantially planar and flexible. By visible light transparent, what is meant is that information (e.g., text, images, or figures) that is rendered by the display can be viewed through the touch sensor. The viewability and transparency can be achieved for touch sensors including conductors in the form of a deposited metal, even metal that is deposited with thickness great enough to block light, if the metal is deposited in an appropriate micropattern.

The conductive micropattern 140 includes at least one visible light transparent conductive region overlaying a viewable portion of the display that renders information. By visible light transparent conductive, what is meant is that the portion of the display can be viewed through the region of conductive micropattern and that the region of micropattern is electrically conductive in the plane of the pattern, or stated differently, along the major surface of the substrate onto which the conductive micropattern is deposited and to which it is adjacent.

In some embodiments, the articles described herein comprise a first conductive micropattern comprising linear traces defining a first open mesh of a repeating cell geometry disposed on or in the visible light transparent substrate and a second conductive micropattern comprising linear traces defining a second open mesh of a repeating cell geometry electrically isolated from the first conductive micropattern. The second conductive micropattern may be disposed on the same substrate as the first conductive micropattern, or it may be disposed on another substrate. The second conductive micropattern overlays the first conductive micropattern in particular arrangements as will be described.

In some embodiments, both conductive micropatterns form at least a portion of a touch sensor, for example a touch screen sensor, as just described.

Alternatively, in another embodiment, one of the conductive micropatterns forms at least a portion of a touch sensor, for example a touch screen sensor, and the other conductive micropattern may function as an antenna for wireless communication.

In yet another embodiment, one of the conductive micropatterns forms at least a portion of a touch sensor, for example a touch screen sensor, and the other conductive micropattern may function as an electromagnetic interference (EMI) shield.

In yet another embodiment, one of the conductive micropatterns forms at least a portion of an antenna for wireless communication and the other conductive micropattern may function as an electromagnetic interference (EMI) shield.

Figure 3A:
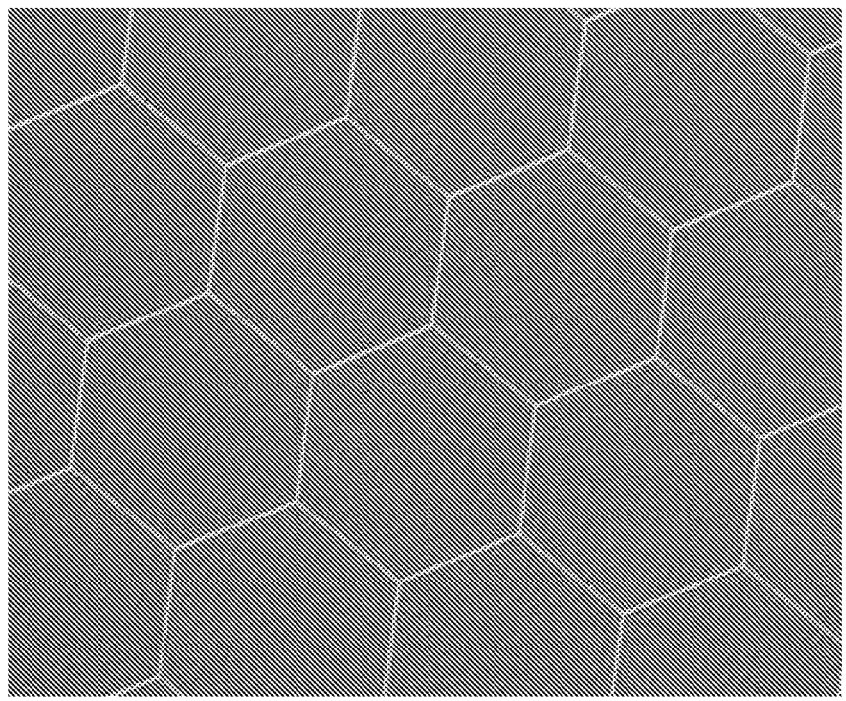
FIG. 3A is a scanning electron photomicrograph of the geometry for a regular hexagonal mesh (sometimes referred to as "hex" mesh) conductive micropattern.
Figure 3B:
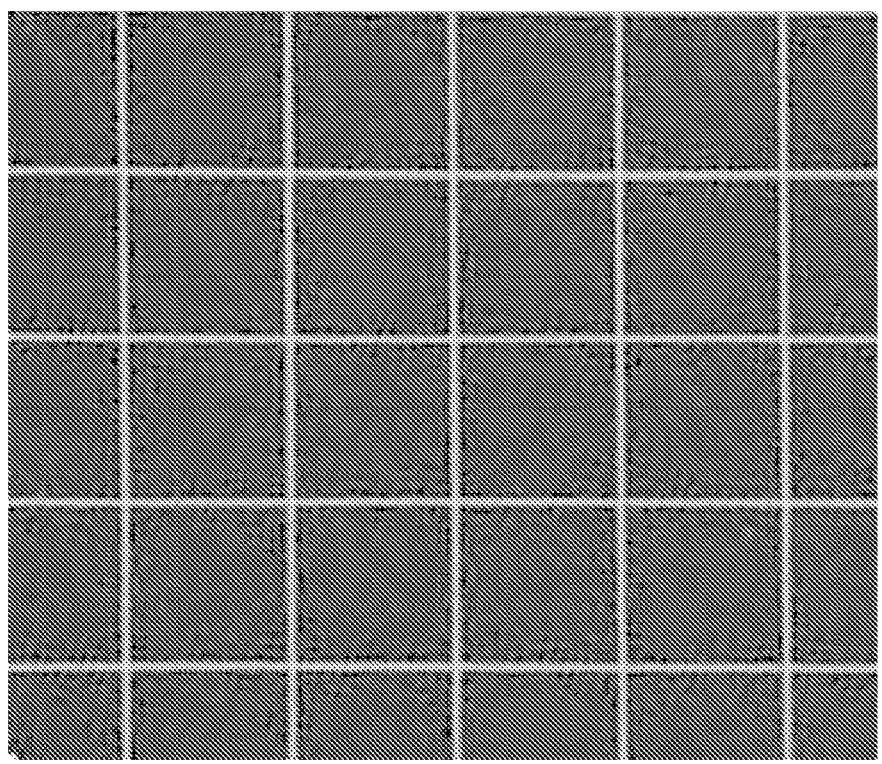
FIG. 3B is a scanning electron photomicrographs of the geometry for a square mesh conductive micropattern.

Preferred conductive micropatterns include regions with two dimensional meshes (or simply, meshes), where a plurality of linear micropattern features (often referred to as conductor traces or metal traces) such as micropatterned lines define enclosed open areas within the mesh. The open areas defined by the (e.g. metal) micropattern can be described as cells such as square geometry cells, as depicted in FIG. 3B, and (i.e. regular) hexagon geometry cells, as depicted in FIG. 3A.

Figure 4A:
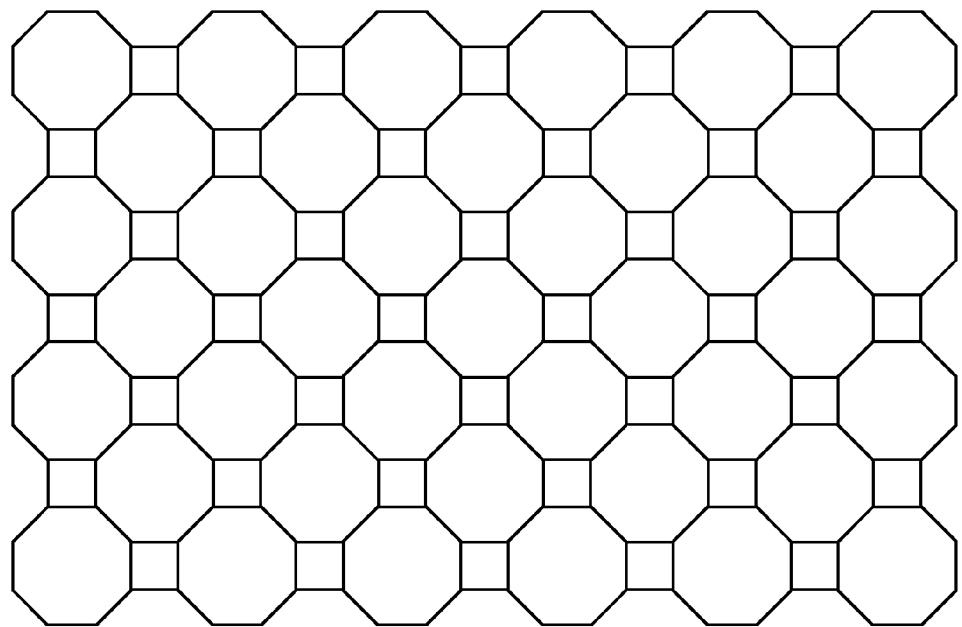
FIGS. 4A and 4B are illustrations depicting open meshes of a repeating cell geometry comprising a combination of square and octagonal cells.
Figure 4B:
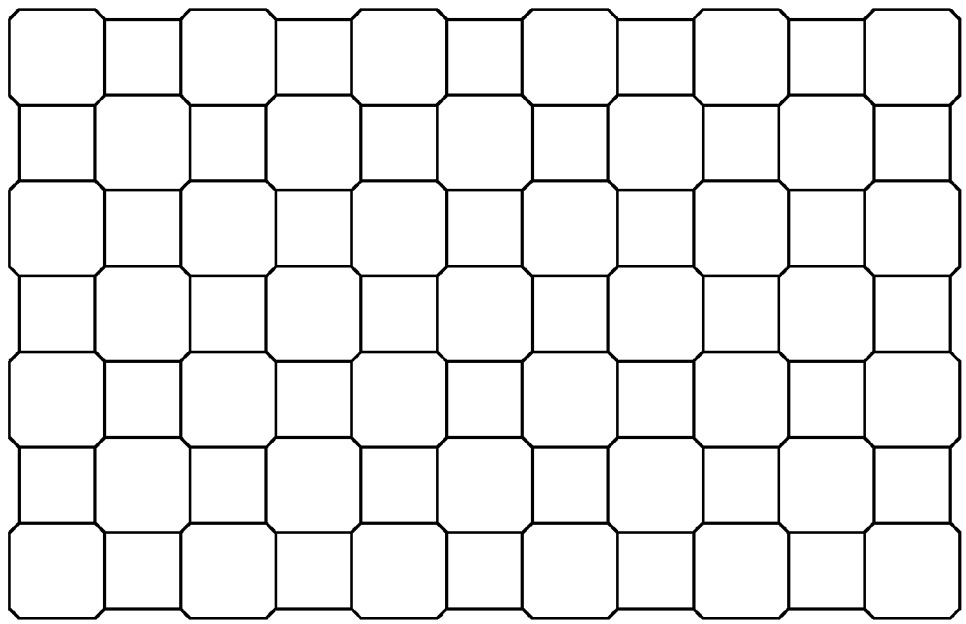

The first and second conductive micropatterns generally comprise linear traces defining an open mesh of a repeating cell geometry. By repeating cell geometry, it is meant that the micropattern has translational symmetry. Although FIGS. 3A and 3B depict cell designs having array of cells wherein the cells have the same dimension and same cell geometry, the conductive micropattern may also have a repeating cell geometry that comprises two or more different cell geometries. For, example FIGS. 4A and 4B are illustrations depicting an open mesh of a repeating cell geometry wherein the repeat segment comprises a combination of a square cell and an octagonal cell. Typically, the micropattern repeats over a relatively short distance. In some embodiments, the repeat segment comprises no greater than 2 or 3 cells. Although the depicted open meshes include various arrangements of polygonal cell geometries with straight line borders, the cells may also be defined by wavy or irregular linear traces, provided that the cells form a micropattern having a repeating pattern. Hence, it is within the scope of this disclosure for a repeating cell geometry to include multiple cells having different geometries and/or different sizes, provided that a repeat segment (or primitive) is present that can be translated in at least one direction for at least a portion of the overall mesh or conductive micropattern.

As used herein, the geometry of a cell refers to its shape, and is distinguished from its dimension(s). Cell geometries include squares, non-square rectangles, hexagons, octagons, other polygons, or other free-form shapes. A regular hexagon has a different shape than a non-regular hexagon wherein at least one of the edges has a different length from another edge or at least one included angle is not equal to 120 degrees. When two cells have both the same shape and same dimension, the cells can be superimposed onto one another.

In some embodiments, either the first or the second micropattern comprises a (e.g. repeating) pattern of cells having a regular cell geometry. In some embodiments, both the first and the second micropattern comprise a (e.g. repeating) pattern of cells having a regular cell geometry. In some embodiments, both the first and second micropattern comprise cells having the same regular cell geometry. By regular cell geometry, it is meant that the cells of the micropattern have the shape of a regular polygon. A regular polygon has all edges of equal length and all included angles of equal magnitude.

In some embodiments, the conductive traces defining the conductive micropattern are designed not to include segments that are approximately straight for a distance greater than the combined edge length of five adjacent cells, preferably four adjacent cells, more preferably three adjacent cells, even more preferably two adjacent cells. Most preferably, the traces defining the micropattern are designed not to include segments that are straight for a distance greater than the edge length of a single cell. Accordingly, in some embodiments, the traces that define the micropattern are not straight over long distances, e.g., 10 centimeters, 1 centimeter, or even 1 millimeter. Patterns with minimal lengths of straight line segments, as just described, are particularly useful for touch screen sensors with the advantage of causing minimal disturbance of display viewability.

In some embodiments, the first and second micropatterns each comprise a square mesh. In other embodiments, one of the micropatterns comprises a square mesh and the other micropattern a (e.g. regular) hexagonal mesh. Preferred overlaid conductive micropatterns comprise a first and second micropattern region with two dimensional contiguous (e.g. metal) meshes, wherein at least a portion of the linear traces that form the mesh are non-parallel, such as certain polygonal networks such as (e.g. regular) triangular, pentagonal, and (e.g. regular) hexagonal networks. More preferably, the first and second micropatterns each comprise a (e.g. regular) hexagonal mesh.

The two-dimensional geometry of the conductive micropattern (that is, geometry of the pattern in the plane or along the major surface of the substrate) can be designed, with consideration of the optical and electrical properties of the conductor material, to achieve special transparent conductive properties that are useful in touch screen sensors.

Appropriate micropatterns of conductor for achieving transparency of the sensor and viewability of a display through the sensor have certain attributes. First of all, regions of the conductive micropattern through which the display is to be viewed should have an area fraction of the sensor that is shadowed by the conductor of less than 50%, or less than 25%, or less than 20%, or less than 10%, or less than 5%, or less than 4%, or less than 3%, or less than 2%, or less than 1%, or in a range from 0.25 to 0.75%, or less than 0.5%.

The open area fraction (or open area or Percentage of Open Area) of a conductive micropattern, or region of a conductive micropattern, is the proportion of the micropattern area or region area that is not shadowed by the conductor. The open area is equal to one minus the area fraction that is shadowed by the conductor, and may be expressed conveniently, and interchangeably, as a decimal or a percentage. Area fraction that is shadowed by conductor is used interchangeably with the density of lines for a micropatterned conductor. Micropatterned conductor is used interchangeably with electrically conductive micropattern and conductive micropattern. Thus, for the values given in the above paragraph for the fraction shadowed by conductor, the open area values are greater than 50%, greater than 75%, greater than 80%, greater than 90%, greater than 95%, greater than 96%, greater than 97%, greater than 98%, greater than 99%, 99.25 to 99.75%, 99.8%, 99.85%, 99.9% and even 99.95. In some embodiments, the open area of a region of the conductor micropattern (e.g., a visible light transparent conductive region) is between 80% and 99.5%, in other embodiments between 90% and 99.5%, in other embodiments between 95% and 99%, in other embodiments between 96% and 99.5%, in other embodiments between 97% and 98%, and in other embodiments up to 99.95%. With respect to the reproducible achievement of useful optical properties (e.g. high transmission and invisibility of conductive pattern elements) and electrical properties, using practical manufacturing methods, preferred values of open area are between 90 and 99.5%, more preferably between 95 and 99.5%, and in some embodiments between 95 and 99.95%.

To minimize interference (e.g. with the pixel pattern of some displays) and to avoid viewability of the pattern elements (e.g., conductor lines) by the naked eye of a user or viewer, the minimum dimension of the conductive pattern elements (e.g., the width of a line or conductive trace) should be less than or equal to approximately 50 micrometers, or less than or equal to approximately 25 micrometers, or less than or equal to approximately 10 micrometers, or less than or equal to approximately 5 micrometers, or less than or equal to approximately 4 micrometers, or less than or equal to approximately 3 micrometers, or less than or equal to approximately 2 micrometers, or less than or equal to approximately 1 micrometer, or less than or equal to approximately 0.5 micrometer. In the design of one or more overlaid conductive micropatterns, one may include concepts known in the art for minimizing interference such as moiré effects between the one or more overlaid conductive micropatterns and the display pixels.

In some embodiments, the minimum dimension of conductive pattern elements is between 0.5 and 50 micrometers, in other embodiments between 0.5 and 25 micrometers, in other embodiments between 1 and 10 micrometers, in other embodiments between 1 and 5 micrometers, in other embodiments between 1 and 4 micrometers, in other embodiments between 1 and 3 micrometers, in other embodiments between 0.5 and 3 micrometers, and in other embodiments between 0.5 and 2 micrometers. With respect to the reproducible achievement of useful optical properties (e.g. high transmission and invisibility of conductive pattern elements with the naked eye) and electrical properties, and in light of the constraint of using practical manufacturing methods, preferred values of minimum dimension of conductive pattern elements are between 0.5 and 5 micrometers, more preferably between 1 and 4 micrometers, and most preferably between 1 and 3 micrometers.

It has been found that certain arrangements of overlaid micropatterns result in low visibility for the combination of micropatterns; whereas other arrangements result in high visibility for the combination of micropatterns.

Figure 5A:
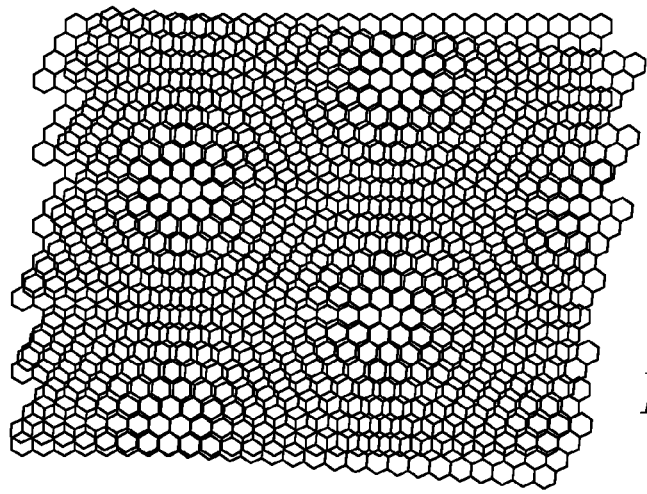
FIGS. 5a-5i are illustrations depicting two layers of the same regular hexagonal mesh overlaid such that the second micropattern is orientated relative to the first micropattern at increasing angles, starting with 5 degrees for FIG. 5a and increasing respectively from FIGS. 5a to 5i in 5 degree increments.
Figure 5B:
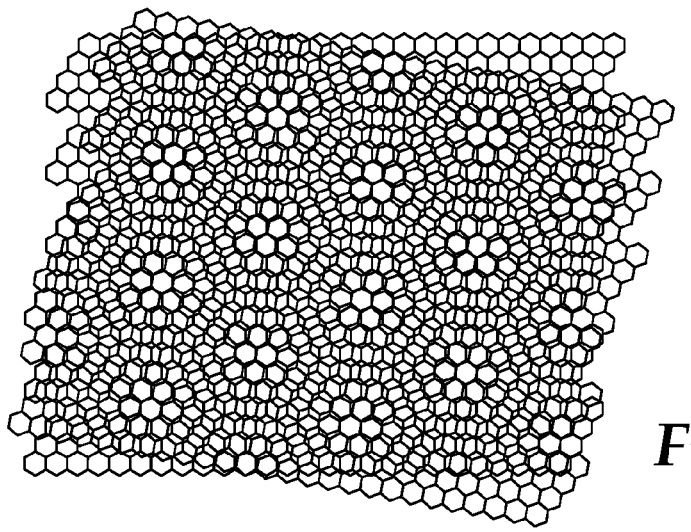
Figure 5C:
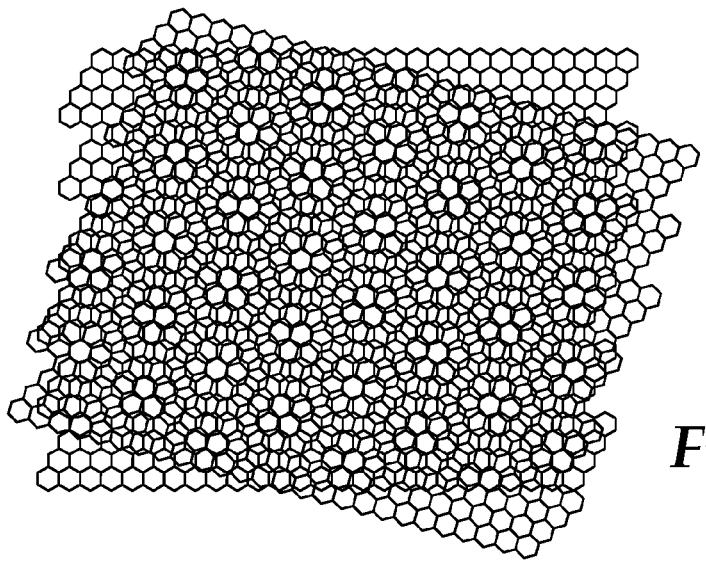
Figure 5D:
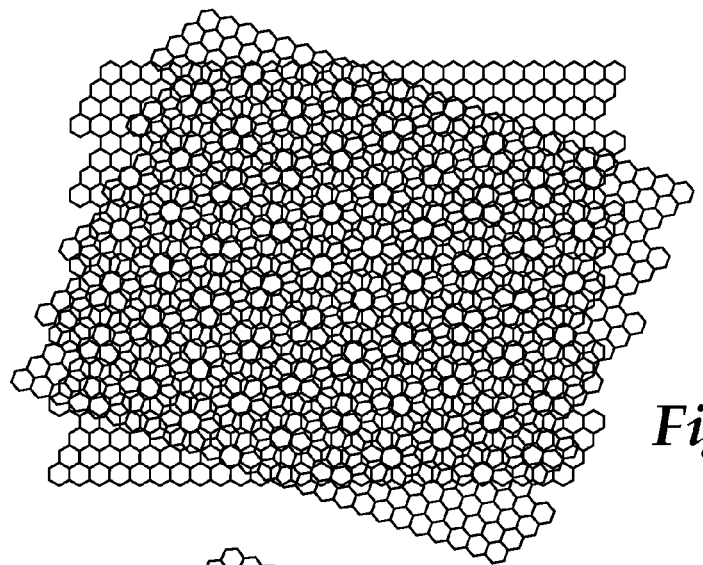
Figure 5E:
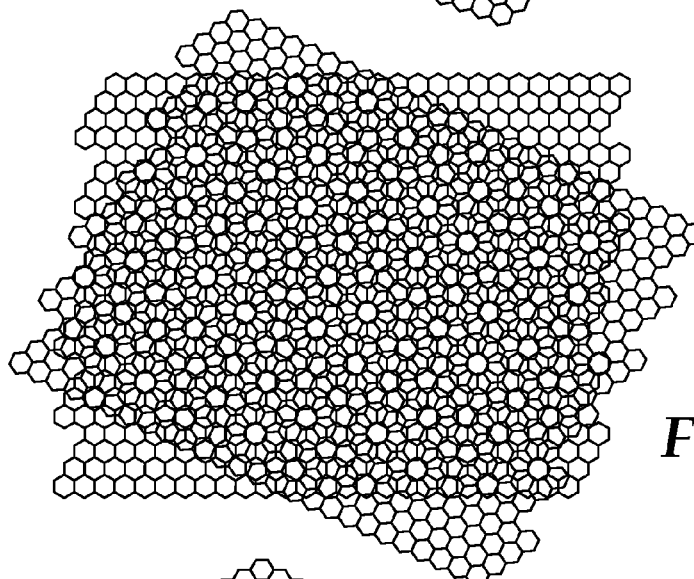
Figure 5F:
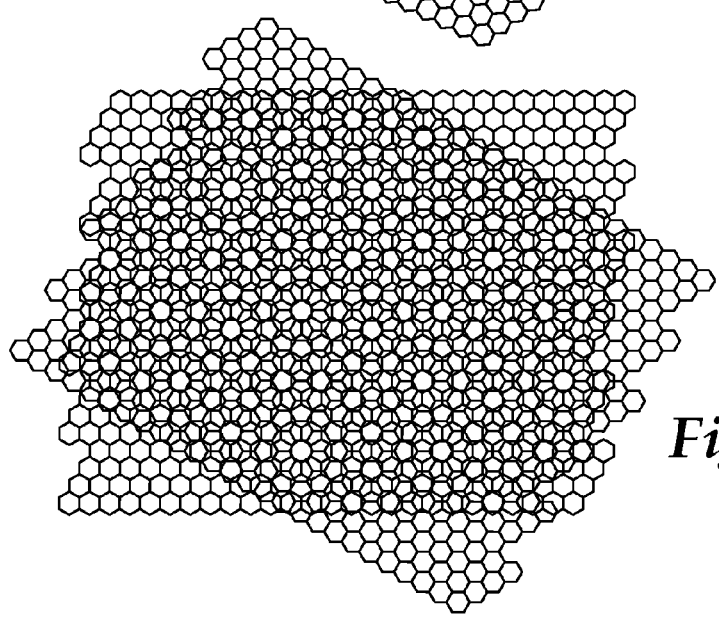
Figure 5G:
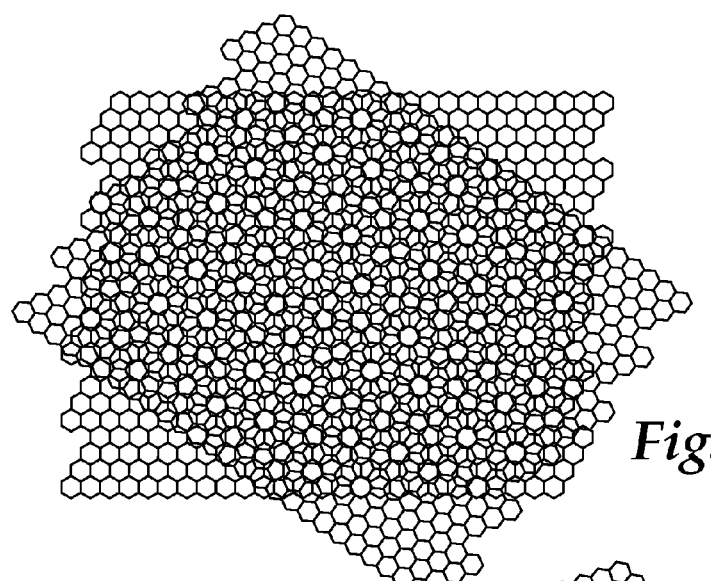
Figure 5H:
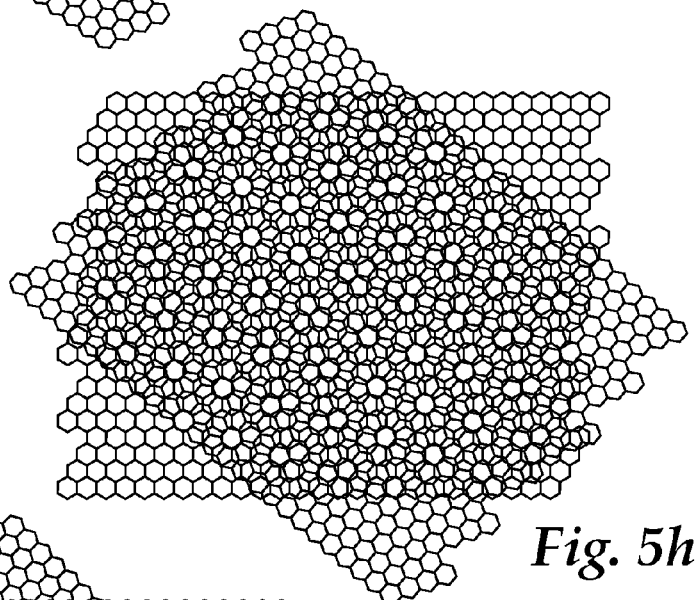

FIGS. 5a-5c are illustrations depicting two layers of the same regular hexagonal mesh overlaid. The second micropattern is rotated relative to the first micropattern at increasing angles, starting with 5 degrees for FIG. 5a and increasing respectively from FIGS. 5a to 5c in 5 degree increments. In FIG. 5a, an apparent composite pattern is present wherein the center of each composite pattern has a diameter of at least about 4 cells. Hence, the apparent composite pattern has spatial dimensions greater than the dimensions of conductive features or the spacing between conductive features for either micropattern. Further, the apparent composite pattern typically has spatial dimensions greater than the repeat segment of the repeating geometry. In FIG. 5b-and 5c, the size of the apparent composite pattern is smaller, having a center portion spanning about 3 and 2 cells in diameter, respectively. For illustration purposes, the individual linear traces of the meshes of FIGS. 5a-5i are apparent and identifiable. The hexagonal cells are also apparent and identifiable. However, when the pattern is a micropattern, the individual linear traces are not identifiable, nor are the individual cells identifiable. However, the composite pattern that was created by the overlay of the micropatterns is highly visible (i.e. apparent), but not necessarily identifiable.

Particular designs and arrangements of overlaid conductive mesh micropatterns (e.g. with repeating cell geometry) can have low visibility when combined with periodically pixilated displays, particularly when certain designs are used. It is surmised that the visibility can be even lower than some conductive mesh micropatterns having random or pseudo-random cell geometry. Importantly, the designs and arrangement relate to reducing visibility when two conductive micropatterns are overlaid.

In one embodiment of obtaining low visibility, the second conductive micropattern overlays the first conductive micropattern such that at least a portion of the linear traces of the second conductive micropattern are non-parallel to the linear traces of first conductive micropattern.

It is within the scope of this disclosure for the first and second conductive micropatterns to be arranged intentionally with a specific relative orientation. Two conductive micropatterns arranged with a specific relative orientation can have a defined angle (or defined bias angle) with respect to each other. The angle of one conductive micropattern with respect to second conductive micropattern is readily evident when the two micropatterns comprise repeat segments having the same geometry of cell(s). The following includes a procedure for defining the bias angle for some embodiments. When the two micropatterns comprise repeat segments having the same geometry of cell(s), one can define for the two micropatterns the same sets of equivalent directions based on the rotational symmetry of the single micropattern geometry the micropatterns share. For example, for a hexagonal mesh, six equivalent directions can be selected, associated with the mesh geometry's six-fold rotational symmetry. As another example, for a square mesh, four equivalent directions can be selected, associated with the mesh geometry's four-fold rotational symmetry. With such equivalent directions defined in the same way for the two meshes, one has a basis for defining or measuring the angle (i.e., bias angle or relative orientation) between two conductive micropatterns. The angle between the two conductive micropatterns is the minimum angle separating equivalent directions of the first conductive micropattern from the equivalent directions of the second conductive micropattern. Still in the case where the two conductive micropatterns are mesh micropatterns having the same repeat segment cell geometry, the visual appearance of the combination of micropatterns will be periodic with respect to changing bias angle. The angular period of the changing visual appearance with increasing bias angle will be equal to 360 degrees divided by the level of rotational symmetry (1 for no rotational symmetry, 2 for two-fold rotational symmetry, 3 for three-fold rotational symmetry, 4- for four-fold rotational symmetry, and 6 for six-fold rotational symmetry, for example). The term repeat angle is used herein to describe the angular period. Thus, unique (in terms of visual appearance) combined geometries for the combination of two conductive micropatterns comprising the same cell geometry will exist only over a range of angles from 0 degrees to [360/level of rotational symmetry] degrees. Although the combined geometry for the overlaid micropatterns is periodic with respect to bias angle (with a repeat angle as just described), with respect to the overall appearance of the combined micropatterns, it is sometimes just as useful to define the bias angle with respect to one half of the repeat angle. This is because the overall visual appearance can be the same for a bias angle of x as it is for a bias angle of [repeat angle minus x], for an x less than the one half the repeat angle. Thus, the full range of visual appearance of combined micropatterns can be defined within the bias angle range of zero degrees to one half of the repeat angle. It is useful in some cases to define the bias angle between conductive micropatterns comprising the same mesh geometry as a fraction of the repeat angle. In some embodiments, the bias angle is between 0.1 to 0.9 times the repeat angle. In preferred embodiments, the bias angle is between 0.1 and 0.4 or between 0.6 and 0.9 times the repeat angle. In other preferred embodiments, the bias angle is between 0.2 and 0.3 or between 0.7 and 0.8 times the repeat angle.

Figure 5I:
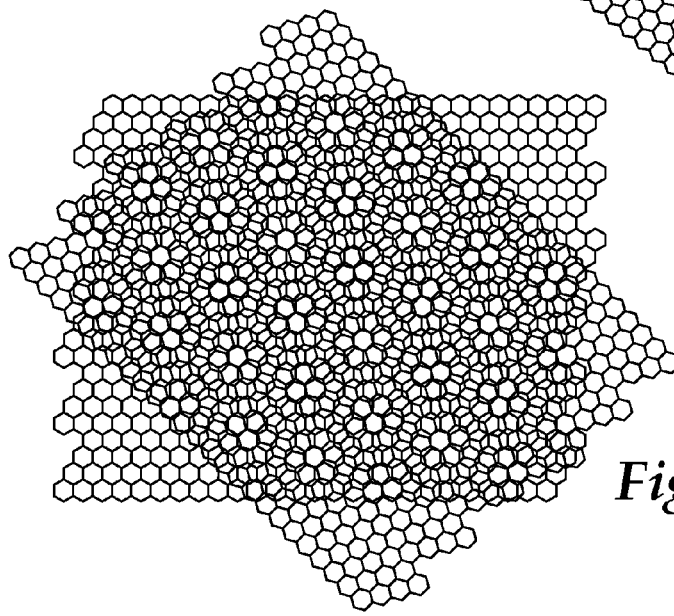

With reference to FIGS. 5a-5i, in one embodiment the second conductive micropattern has linear traces that are non-parallel relative to the linear traces of the first conductive micropattern by rotating the second micropattern relative to the first micropattern. The geometry of the first conductive micropattern is the same as the geometry of the second conductive micropattern. The geometry for both micropatterns is a hexagonal mesh with six-fold rotational symmetry. The repeat angle is 60 degrees. The use of a relative bias angle is particularly useful when the first and second micropattern have the same cell (e.g. regular) geometry and the same cell dimension. It is also very useful to rotate one conductive micropattern comprising a regular cell geometry with respect to a second conductive micropattern comprising the same regular cell geometry when the two micropatterns have cells of different dimension. As the angle of rotation (bias angle) increases from about 5 degrees (0.083 times the repeat angle), as depicted in FIG. 5a to about 15 degrees (0.25 times the repeat angle) as depicted in FIG. 5c, the visibility can be diminished. Although the angle of rotation can vary depending on the specific cell geometry and cell dimension, the angle of rotation is preferably at least 10 degrees (as illustrated in FIG. 5b) and less than 45 degrees (as illustrated in FIG. 5i).

Figure 6:
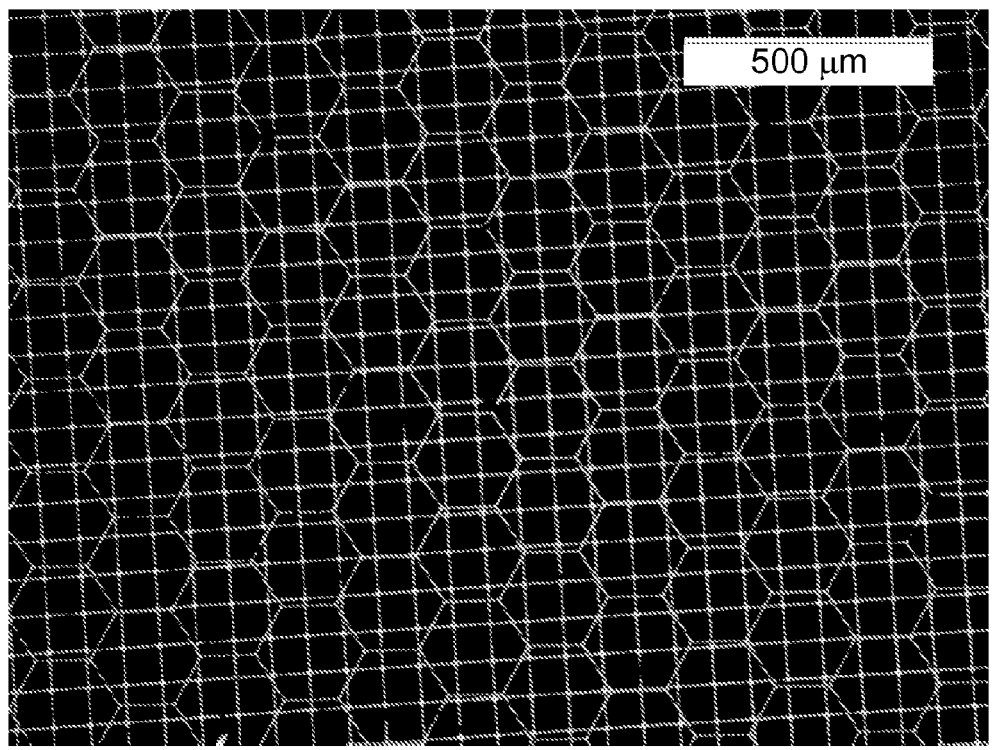
FIG. 6 is an optical photomicrograph (reflection illumination) depicting two overlaid layers of a hexagonal metallic mesh having a cell diameter of 200 micrometers and a square mesh having a cell pitch in both directions (length and width of squares) of 80 micrometers, the conductive traces are approximately 2 micrometers in width.

In another embodiment, the second conductive micropattern has linear traces that are non-parallel to the linear traces of the first conductive micropattern as a result of the second conductive micropattern having a different cell geometry from the cell geometry of the first conductive micropattern. For example, with reference to FIG. 6, the first conductive micropattern may have a square cell geometry and the second conductive micropattern a hexagonal cell geometry, or vice-versa. Although, a portion of the linear traces of the square cells can be parallel to the linear traces of the hexagon cells, a portion of the linear traces are non-parallel.

In another embodiment for obtaining low visibility, the second conductive micropattern has a different cell dimension from the cell dimension of the first conductive micropattern. The term cell dimension refers generally to the size of a cell of a mesh conductive micropattern. For cells having the shape of regular polygons, it is convenient to define (for the purpose of comparing the cell dimensions of two conductive micropatterns) a cell dimension as the width of the cell, for example the edge length of a square cell, or as a further example the separation between parallel faces of a hexagonal cell (also referred to herein as the diameter or pitch of a hexagon).

In some embodiments, the average width or pitch of a regular cell formed from the conductive traces is typically no greater than 500 microns, 450 microns, or 400 microns. In some preferred embodiments, both of the micropatterns have an average cell width no greater than 350 microns, 300 microns, 250 microns, 200 microns, 150 microns, 100 microns, or 50 microns.

For irregular cell shapes (or even for regular cell shapes), for the purpose of comparing the cell dimensions of two mesh conductive micropatterns having repeating cell geometries, a cell dimension can be defined as the average length of all line segments (i.e., of all orientations) that pass through the centroid of the cell shape and that extend in each direction to the boundary of the cell shape.

Two mesh conductive micropatterns having the same repeating cell geometries may have different cell dimensions. Also, two mesh conductive micropatterns having different repeating cell geometries may have different cell dimensions. In some embodiments, the cell dimension of the first conductive micropattern is equal to between 1.1 and 6 times the cell dimension of the second conductive micropattern (i.e. ratios of 1:1.1 to 1:6 respectively. It is preferred for the cell dimension of the first conductive micropattern to be equal to between 1.2 and 3 times the cell dimension of the second conductive micropattern, more preferably between 1.2 and 2.

In some preferred embodiments, the first conductive micropattern and the second conductive micropattern have the same repeating cell geometry, wherein the cell dimension of the first conductive micropattern is between 1.1 and 6 times the cell dimension of the second conductive micropattern, and there is a bias angle between the patterns of between 0.1 and 0.9 times the repeat angle. In some embodiments, the bias angle between the patterns of between 0.1 and 0.4 or between 0.6 and 0.9 times the repeat angle. In some of these embodiments, the repeating cell geometry comprises regular polygons. In some of these embodiments, the repeating cell geometry is composed of a single regular polygon. In some of these embodiments, the repeating cell geometry is composed of regular hexagons.

In some preferred embodiments, the first conductive micropattern and the second conductive micropattern have the same repeating cell geometry, wherein the cell dimension of the first conductive micropattern is between 1.2 and 3 times the cell dimension of the second conductive micropattern, and there is a bias angle between the patterns of between 0.1 and 0.4 or between 0.6 and 0.9 times the repeat angle. In some of these embodiments, the repeating cell geometry comprises regular polygons. In some of these embodiments, the repeating cell geometry is composed of a single regular polygon. In some of these embodiments, the repeating cell geometry is composed of regular hexagons.

In some preferred embodiments, the first conductive micropattern and the second conductive micropattern have the same repeating cell geometry, wherein the cell dimension of the first conductive micropattern is between 1.1 and 6 times the cell dimension of the second conductive micropattern, and there is a bias angle between the patterns of between about 10 degrees and about 45 degrees. In some embodiments, the cell dimension of the first conductive micropattern is between 1.2 and 3 times the cell dimension of the second conductive micropattern. In some of these embodiments, the repeating cell geometry comprises regular polygons. In some of these embodiments, the repeating cell geometry is composed of a single regular polygon. In some of these embodiments, the repeating cell geometry is composed of regular hexagons.

The visibility of the overlaid micropattern can be determined by using various methods. In some embodiments, the visibility of the overlaid micropattern is determined by use of (i.e. human) test panels to evaluate the visibility (according to the method described in the examples).

Although mathematical models such as described in "A Standard Model for Foveal Detection of Spatial Contrast" (Journal of Vision, 2005 5, 717-740) have been used to evaluate the visibility of images having sufficient dimension such that the images are apparent (i.e. readily seen, visible) and identifiable (i.e. to ascertain definitive characteristics of) to the unaided human eye of normal (i.e. 20/20) vision, such mathematical model is not believed to have been adapted for use to determine the visibility of non-apparent micropatterns or overlaid micropatterns.

Accordingly, in other embodiments, a method of determining the visibility of a patterned substrate is described comprising providing a digital image of a micropatterned substrate such as overlaid micropatterns and calculating the spatial contrast threshold of the digital image with a model for foveal detection (i.e. standard spatial observer model).

Mathematical models can be favored relative to (i.e. human) test panels for a variety of reasons. Test panels are typically more subjective and generally require a multiple of participants to obtain a statistically meaningful result. Further, the use of test panels typically requires that actual samples be made of each of the micropatterns in order that the visibility can be evaluated.

The input for a mathematical model can also be generated by providing a sample comprising (e.g. a light transparent) substrate and a non-transparent micropattern, simulating the lighting conditions of the sample when the sample is viewed during use; and digitally imaging the sample. However, the mathematical model can also utilize a digital image of a digitally designed micropattern. Hence, is this embodiment, the visibility of a micropattern or overlaid micropattern can be evaluated without actually fabricating a physical sample. This is amenable to more efficiently evaluating the visibility of a multitude of micropatterns without actual fabrication thereof.

Regardless of whether, a (i.e. human) test panel or a mathematical model is used, the digital image of the micropatterned substrate, or digital design thereof, is typically cropped to include only the micropattern. Any edges or borders that arise as a result of cropping that are not actually present in the overlaid patterns should be omitted prior to calculating the contrast thresholds. Although during transmission, (i.e. when the micropattern is viewed with backlightling transmitting through the substrate) the metal micropattern appears dark against a transparent background, in order to simulate the micropattern's appearance when viewed with reflected light, it is preferred to digitally alter (such as by reversing the polarity of the image on a computer screen) such that the transparent substrate is dark and the micropattern is light. Different contrast threshold values may be computed by the model in the absence of digitally altering the micropattern image in this manner.

The calculated contrast threshold described herein (as conducted as described in the examples) have been found to correspond with the visibility as determined by (i.e. human) test panels. When the micropattern or overlaid micropatterns have a contrast threshold of less than −35 decibels, the micropattern is most visible. Hence, the contrast threshold is preferably greater than −35 decibels. When the contrast threshold is greater than −30 decibels or −25 decibels, the micropattern (e.g. beat pattern of overlaid micropattern) is still apparent and identifiable. However, when the micropattern or overlaid micropatterns has a predicted contrast threshold of greater than −24, −23, −22, −21 or −20 decibels, the micropattern or overlaid micropatterns becomes substantially less visible. In preferred embodiments, the contrast threshold is greater than −15 decibels, −10 decibels, or −5 decibels. When the micropattern or overlaid micropatterns has a predicted contrast threshold of 0 or greater, the micropattern or overlaid micropattern is not visible. As the contrast threshold increases, the uniformity in appearance of the sample increases. A difference in contrast threshold values of 1 decibel is a 'just noticeable difference' to the average human viewer.

The distance for calculating the contrast threshold can vary, yet is chosen to correlate with a viewing distance of interest, i.e. typically the average viewing distance of the micropatterned substrate during ordinary use. For example, if the article is a touch sensor display of a cell phone, the normal viewing distance is typically about 280 mm to 300 mm. This corresponds to a distance unit of the model of about 30000 (i.e. 30000 foveal detection model distance units). In some embodiments, the preferred (e.g. overlaid) micropattern has the contrast thresholds, as described above, at less than 30000 distance units such as 25000 or 20000 or 15000.

The sample size utilized in the calculation is generally of sufficient size to be representative of the physical and/or designed sample. If the overlaid pattern (the net pattern) is larger than the sample size but within a viewing area that would be covered by foveal viewing (i.e., 2.13 degrees of visual angle) at the desired viewing distance, one should obtain a sample that would subtend the fovea.

In general, the deposited electrically conductive material reduces the light transmission of the touch sensor. Basically, wherever there is electrically conductive material deposited, the display is shadowed in terms of its viewability by a user. The degree of attenuation caused by the conductor material is proportional to the area fraction of the sensor or region of the sensor that is covered by conductor, within the conductor micropattern.

In general, it is desirable for a transparent touch screen sensor to exhibit a low value of haze. Haze refers to a property related to the scattering of light as it passes through a medium, e.g. as measured by a Haze-Gard instrument (Haze-Gard plus, BYK Gardner, Columbia, Md.). In some embodiments, the touch screen sensor exhibits haze less than 10%, in some embodiments less than 5%, in some embodiments less than 4%, in some embodiments less than 3%, in some embodiments less than 2%.

Embodiments are disclosed which achieve a desirable combination of high transmission (also referred to as visible light transmittance), low haze, and low conductor trace visibility for regions including conductor micropatterns. The conductor micropatterns are thus especially useful when used as part of a sensing area or region of a touch screen sensor display, e.g. when the micropattern overlays a viewable region of the display.

In some embodiments, in order to generate a visible light transparent display sensor that has uniform light transmission across the viewable display field, even if there is a non-uniform distribution of sheet resistance, e.g. derived from a non-uniform mesh of conductive material, the sensors include isolated conductor deposits added to the conductor micropattern that serve to maintain the uniformity of light transmittance across the pattern. Such isolated conductor deposits are not connected to the drive device (e.g., electrical circuit or computer) for the sensor and thus do not serve an electrical function.

Similar isolated conductive (e.g. metal) features can be added in regions of space between contiguous transparent conductive regions, e.g. contiguous transparent conductive regions that include micropatterned conductors in the form of two dimensional meshes or networks, in order to maintain uniformity of light transmittance across the sensor, including the transparent conductive regions and the region of space between them. In addition to isolated squares of conductor, other useful isolated deposits of conductor for tailoring optical uniformity include circles and lines. The minimum dimension of the electrically isolated deposits (e.g., the edge length of a square feature, the diameter of a circular feature, or the width of a linear feature) is less than 10 micrometers, less than 5 micrometers, less than 2 micrometers, or even less than 1 micrometer.

With respect to the reproducible achievement of useful optical properties (e.g. high transmission and invisibility of conductive pattern elements), using practical manufacturing methods, the minimum dimension of the electrically isolated deposits is preferably between 0.5 and 10 micrometers, more preferably between 0.5 and 5 micrometers, even more preferably between 0.5 and 4 micrometers, even more preferably between 1 and 4 micrometers, and most preferably between 1 and 3 micrometers. In some embodiments, the arrangement of electrically isolated conductor deposits is designed to lack periodicity. A lack of periodicity is preferred for limiting unfavorable visible interactions with the periodic pixel pattern of an underlying display. For an ensemble of electrically isolated conductor deposits to lack periodicity, there need only be a single disruption to the otherwise periodic placement of at least a portion of the deposits, across a region having the deposits and lacking micropattern elements that are connected to decoding or signal generation and/or processing electronics. Such electrically isolated conductor deposits are said to have an aperiodic arrangement, or are said to be an aperiodic arrangement of electrically isolated conductor deposits. In some embodiments, the electrically isolated conductor deposits are designed to lack straight, parallel edges spaced closer than 10 micrometers apart, e.g. as would exist for opposing faces of a square deposit with edge length of 5 micrometers. More preferably the isolated conductor deposits are designed to lack straight, parallel edges spaced closer than 5 micrometers apart, more preferably 4 micrometers apart, even more preferably 3 micrometers apart, even more preferably 2 micrometers apart. Examples of electrically isolated conductor deposits that lack straight, parallel edges are ellipses, circles, pentagons, heptagons, and triangles. The absence within the design of electrically isolated conductor deposits of straight, parallel edges serves to minimize light-diffractive artifacts that could disrupt the viewability of a display that integrates the sensor.

The impact of the conductor micropattern on optical uniformity can be quantified. If the total area of the sensor, and hence the conductor micropattern, that overlays a viewable region of the display is segmented into an array of 1 millimeter by 1 millimeter regions, preferred sensors include conductor micropatterns wherein none of the regions have a shadowed area fraction that differs by greater than 75 percent from the average for all of the regions. More preferably, none have a shadowed area fraction that differs by greater than 50 percent. More preferably, none have a shadowed area fraction that differs by greater than 25 percent. Even more preferably, none have a shadowed area fraction that differs by greater than 10 percent. If the total area of the sensor, and hence the conductor micropattern, that overlays a viewable region of the display is segmented into an array of 5 millimeter by 5 millimeter regions, preferred sensors include conductor micropatterns wherein none of the regions have a shadowed area fraction that differs by greater than 50 percent from the average for all of the regions. Preferably, none have a shadowed area fraction that differs by greater than 50 percent. More preferably, none have a shadowed area fraction that differs by greater than 25 percent. Even more preferably, none have a shadowed area fraction that differs by greater than 10 percent.

The disclosure allows for the use of metals as the conductive material in a transparent conductive sensor, as opposed to transparent conducting oxides (TCO's), such as ITO.

Examples of useful metals for forming the electrically conductive micropattern include gold, silver, palladium, platinum, aluminum, copper, nickel, tin, alloys, and combinations thereof.

Optionally, the conductor can also be a composite material, for example a metal-filled polymer. The conductor can be reflective, as in the case of thin film metal, for example silver, aluminum, etc. Alternatively, the conductor can be absorptive and appear dark or black, as in the case of a carbon-filled composite conductor, for example as derived from a printable carbon-based conductive ink. Furthermore, the conductor can comprise multiple layers, for example the conductor may comprise a metal layer and an overlayer designed to reduce the reflectivity of the metal or to prevent corrosion of the metal, as is known in the art. This disclosure is not limited with respect to the selection or design of the material that comprises the conductor. However, the concepts developed herein have been found to be particularly useful when reflective conductor patterns are needed or otherwise preferred.

In some embodiments, the (e.g. metal) micropattern is relatively thin, ranging in thickness from about 5 nanometers to about 50 nanometers. In other embodiments, the (e.g. metal) micropattern has a thickness of at least 60 nm, 70 nm, 80 nm, 90 nm, or 100 nm. In some embodiments, the thickness of the (e.g. metal) micropattern is at least 250 nm. In some embodiments, the micropattern is a silver micropattern have a thickness of at least 300 nm, 400 nm, 500 nm, 600 nm, 700 nm, 800 nm, 900 nm, and even 1000 nm or greater. The other embodiments, the micropattern is a gold micropattern having a thickness of at least 300 nm, 350 nm, 400 nm, or greater. Metal micropatterns of increased thickness can be prepared as described in 61/220,407, filed Jun. 25, 2009; incorporated herein by reference.

In preferred embodiments, the (e.g. metal) conductive micropatterned substrates are suitable for use in electronic displays. Electronic displays include reflective displays and displays with internal sources of light. Electronic displays with internal sources of light include illuminated displays. By "illuminated" it is meant "brightened by light or emitting light". The illuminated display may be a liquid crystal display having a backlighting or edge lighting light source that may be external to the core liquid crystal panel but internal to the display device overall. Or the illuminated display may be an emissive display such as a plasma display panel (PDP) or organic light emitting diode (OLED) display. Reflective displays include electrophoretic displays, electrowetting displays, electrochromic displays, and reflective cholesteric liquid crystal displays. The micropatterned substrates of the invention are especially useful as part of an illuminated electronic display.

Conductor micropatterns according to the invention can be generated by any appropriate patterning method, e.g. methods that include photolithography with etching or photolithography with plating (see, e.g., U.S. Pat. Nos. 5,126,007; 5,492,611; 6,775,907). Additionally, the conductor patterns can be created utilizing on one of several other exemplary methods including laser cured masking, inkjet printing, gravure printing, and microreplication; each of which are known in the art and described in greater detail in U.S. Publication No. US2009/0219257; incorporated herein by reference. In some embodiments, the conductive (e.g. metal) micropatterns are prepared via microcontact printing, such as described in 61/220,407, filed Jun. 25, 2009; incorporated herein by reference.

The two-dimensional conductive micropattern can be designed to achieve anisotropic or isotropic sheet resistance in a conductive region (e.g., a visible light transparent conductive region) of the sensor, such as described in U.S. Publication No. US2009/0219257; incorporated herein by reference. By anisotropic sheet resistance, what is meant is that the magnitude of the sheet resistance of the conductive micropattern is different when measured or modeled along two orthogonal directions. By isotropic sheet resistance, what is meant is that the magnitude of the sheet resistance of the conductive micropattern is the same when measured or modeled along any two orthogonal directions in the plane, as in the case for a square grid formed with traces of constant width for both directions.

In some embodiments, transparent conductive regions with different sheet resistance in at least one direction are created by including selective breaks in conductive traces within an otherwise continuous and uniform mesh. This approach of selective placement of breaks is especially useful for generating articles including patterns of visible transparent conductive regions where the optical transmittance across the article is uniform. The starting mesh can be isotropic or anisotropic.

In other embodiments that include selective breaks in an otherwise continuous and uniform mesh, the breaks can be placed in order to create approximately continuously varying sheet resistance in a given direction. In some embodiments, two transparent conductive regions with different sheet resistance in at least one direction are created by including in each of the two regions a contiguous mesh with its own design, each mesh not necessarily including selectively placed breaks. Examples of two meshes with designs that lead to different values of sheet resistance for current passing in a single direction, e.g. the x direction in FIG. 2, include two meshes with the same thickness (dimension in the z direction in FIG. 2) of the same conductive material deposit but with different amounts with current-carrying cross-sectional area (y-z plane in FIG. 2) per unit width in the y direction. One example of such a pair of mesh regions are two square grid regions each comprising conductive traces of width 2 micrometers but with different pitch, e.g. 100 micrometers and 200 micrometers. Another example of such a pair of mesh regions are two rectangular grid regions (non-square, with 100 micrometer pitch in the one direction and 200 micrometer pitch in the orthogonal direction) each comprising conductive traces of width 2 micrometers but with different orientation, e.g. with the long axes of the rectangular cells in the first regions oriented at 90 degrees with respect to the rectangular cells in the second region.

In some embodiments, the sensors include an insulating visible light transparent substrate layer that supports a pattern of conductor, the pattern includes a visible light transparent micropattern region and a region having a larger feature that is not transparent, wherein the visible light transparent micropattern region and the larger feature region include a patterned deposit of the same conductor (e.g., a metal) at approximately the same thickness. The larger feature can take the form of, e.g., a wide conductive trace that makes contact to a visible light transparent conductive micropattern region or a pad for making contact with an electronic decoding, signal generation, or signal processing device. The width of useful larger features, in combination on the same insulating layer with visible light transparent conductive micropattern regions, is e.g. between 25 micrometers and 3 millimeters, between 25 micrometers and 1 millimeter, between 25 micrometers and 500 micrometers, between 25 micrometers and 250 micrometers, or between 50 micrometers and 100 micrometers.

EXAMPLES

The following describe exemplary touch screen sensor designs. They can be fabricated using known photolithographic methods, e.g. as described in U.S. Pat. No. 5,126,007 or U.S. Pat. No. 5,492,611. The conductor can be deposited using physical vapor deposition methods, e.g. sputtering or evaporation, as is known in the art. Unless otherwise noted, the examples below include conductors patterned by a microcontact printing technique (see technique description above and also co-pending US Patent Publication No. US2009/0218310). Each conductive pattern exemplified herein is useful as a transparent touch screen sensor, when connected to decoding circuitry, as is known in the art (e.g., U.S. Pat. Nos. 4,087,625; 5,386,219; 6,297,811; WO 2005/121940 A2).
Visibility of Overlaid Micropatterned Substrates Predicted with the Standard Spatial Observer Model The contrast thresholds of the overlaid micropatterned substrates of Comparative Example A, Example B and Examples 1-25 (unless specified otherwise) were calculated using a version of the mathematical model "Standard A" described in "A Standard Model for Foveal Detection of Spatial Contrast" (Journal of Vision, 2005 5, 717-740). The Standard A model was implemented using Matlab version 7.7.0.471 (R2008b) on a Hewlett-Packard xw8400 workstation using the following parameters.

| Parameter | Fit Value |
|---|---|
| A - Gain | 373.08 |
| $\alpha$ | 0.8493 |
| p | .7786 |
| $f_0$ | 4.1726 (cycles/deg) |
| $f_1$ | 1.3625 (cycles/deg) |
| $\beta$ | 2.4081 |
| $\sigma$ | 0.6273 |

The definition of the above parameters are described in Appendix C and D at pp. 736-737 of "A Standard Model for Foveal Detection of Spatial Contrast" (Journal of Vision, 2005 5, 717-740).

Analyses were conducted assuming a square pixel size of 0.265 mm, and the nominal mean grayscale value in the image was estimated for each foveal block analyzed.

The micropattern analysis was accomplished by:

1. First creating the desired pattern covering at least a few centimeters expanse to allow for later image cropping, using a computer aided drafting or design (CAD) software package (e.g., L-Edit, commercially available from Tanner EDA, a division of Tanner Research Inc., Monrovia, Calif.), and saving the file in the .gds format.

2. The .gds files were then converted to PDF (Portable Document Format) format and saved.

3. Next the PDF files were opened in Adobe Illustrator (Adobe Systems, Inc.; CS2, 12.0.0) and were cropped to include only the micropatterned area.

4. The polarity of the digital image was then reversed such that the background was black and the micropattern was white.

5. The file was again saved in the PDF format.

6. The new PDF file was opened in Adobe Photoshop (Adobe Systems, Inc.; Version 5.5) with maximum image resolution of 9999 pixels per inch. The anti-aliasing option was not selected, so that the images remained all black or white (no imtermediate gray levels).

7. This digital image was then saved as a TIFF (Tagged Image File Format) and then cropped in Matlab to a size of 3,000×3,000 pixels.

The contrast thresholds were then calculated for a viewing distance of 30000 units of distance according to the model which is equivalent to about 28-30 cm.

Comparative Example A

Figure 8:
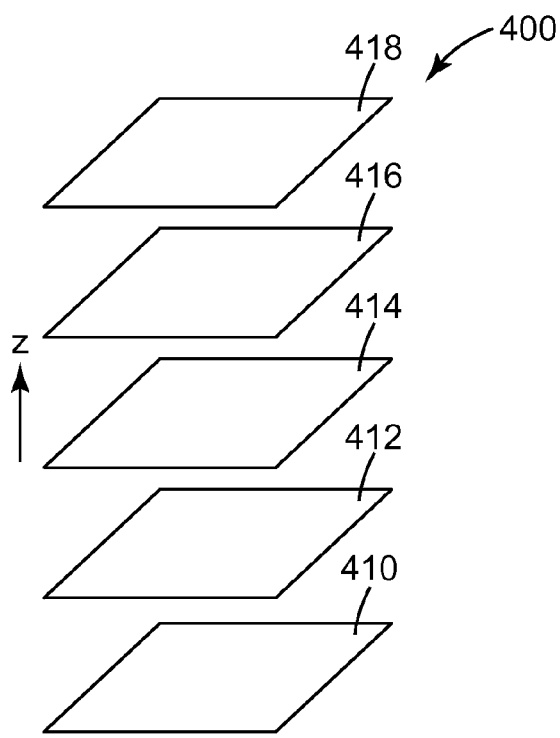
FIG. 8 illustrates the arrangement of layers that are laminated together to form one embodiment of the touch screen sensor, an X-Y grid type projected capacitive touch screen sensor.

A transparent sensor element 400 for a touch screen sensor is illustrated in FIG. 8. The sensor element 400 includes two patterned conductor layers 410, 414, (e.g., an X axis layer and a Y axis layer) two optically clear adhesive layers 412, 416, and a base plate 418, laminated together and depicted as separated in FIG. 8 for clarity. Layers 410 and 414 include transparent conductive mesh bars where one layer is oriented in the x axis direction and the other layer is orientated in the y axis direction, with reference to FIG. 2. The base plate 418 is a sheet of glass measuring 6 centimeter by 6 centimeters in area and 1 millimeter in thickness. A suitable optically clear adhesive is Optically Clear Laminating Adhesive 8141 from 3M Company, St. Paul, Minn. For each of the X-layer and the Y-layer, a clear polymer film with a micropattern of metal is used. A micropattern of thin film gold according to the following description is deposited onto a thin sheet of PET. Suitable PET substrates include ST504 PET from DuPont, Wilmington, Del., measuring approximately 125 micrometers in thickness.

Figure 9:
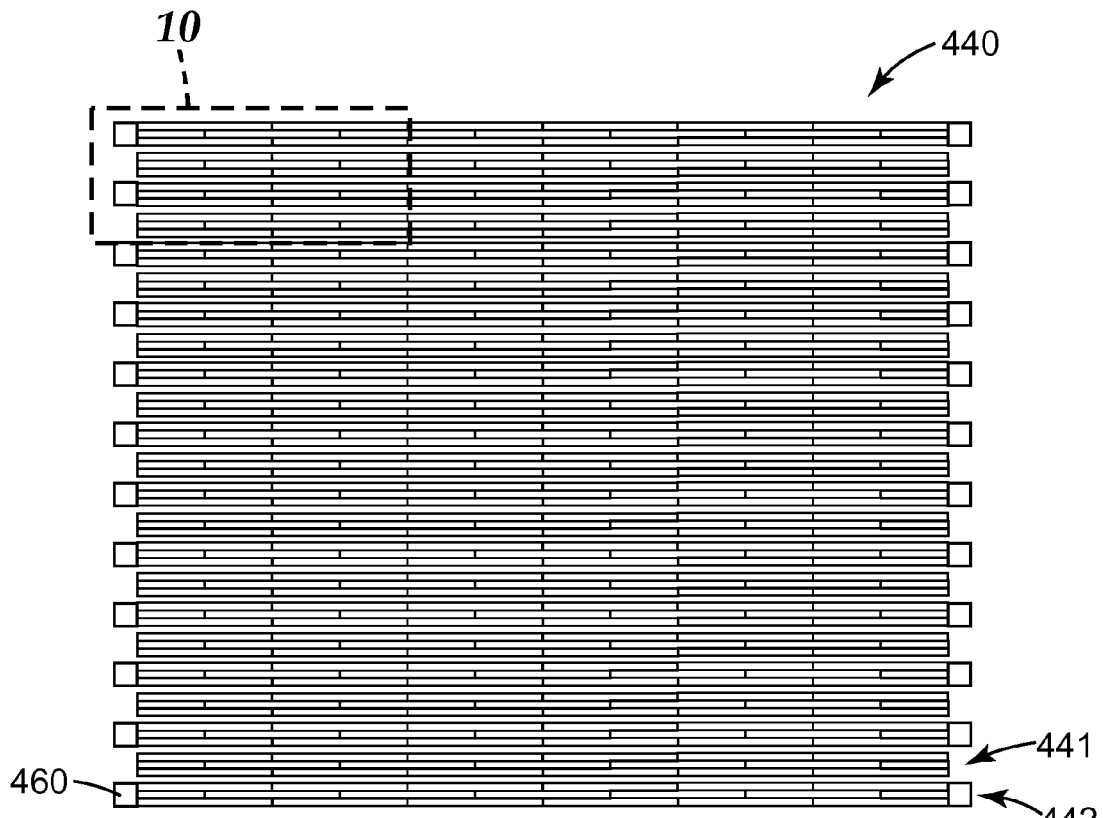
FIG. 9 illustrates a portion of the conductor micropattern for the X-layer or the P-layer of an embodiment of a touch screen sensor according to FIG. 8.
Figure 10:
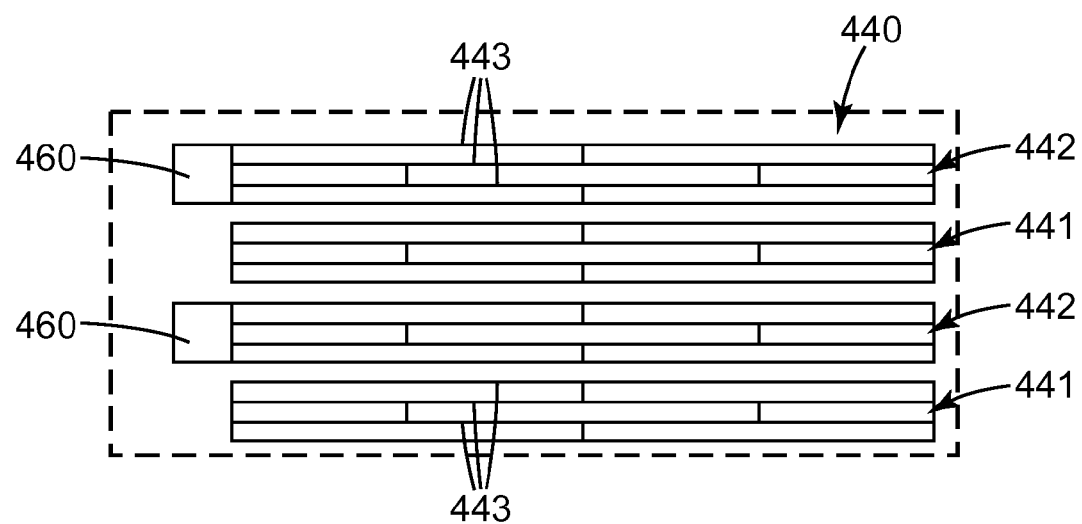
FIG. 10 illustrates a portion of the conductor micropattern illustrated in FIG. 9, the portion including two visible light transparent conductive mesh bars, each contacting a larger feature in the form of a contact pad, as well as electrically isolated conductive deposits in the space between the contacted mesh bar regions.

The micropattern 440 is depicted in FIG. 9 and FIG. 10. The thickness of the gold is about 100 nanometers. The micropattern has transparent conductive regions in the form of a series of parallel mesh bars 442. In addition to mesh bars that are terminated with square pads 460 (approximately 2 millimeters by 2 millimeters in area, comprising continuous conductor in the form of thin film gold with thickness approximately 100 nanometers) for connection to an electronic device for capacitive detection of finger touch to the base plate, there are mesh bars 441 that are electrically isolated from the electronic device. The isolated mesh bars 441 serve to maintain optical uniformity across the sensor. Each bar is comprised of a mesh made up of narrow metallic traces 443, the traces 443 measuring approximately 5 micrometers in width. The mesh bars each measure approximately 2 millimeters in width and 66 millimeters in length. Within each mesh bar are rectangular cells measuring approximately 0.667 millimeters in width and 12 millimeters in length. This mesh design serves to provide ties between long-axis traces in each mesh bar, to maintain electrical continuity along the mesh bar, in case of any open-circuit defects in the long axis traces. However, as opposed to the use of a square mesh with 0.667 millimeter pitch having such ties, the rectangular mesh of FIG. 9 and FIG. 10 trades off sheet resistance along the mesh bar with optical transmittance more optimally. More specifically, the mesh bar depicted in FIG. 9 and FIG. 10 and a 2 millimeter wide mesh bar comprising a square mesh with 0.667 millimeter pitch would both have essentially the same sheet resistance along the long axis of the mesh bar (approximately 50 ohms per square); however, the square grid would occlude 1.5% of the area of the transparent conductive region and the mesh depicted in FIG. 9 and FIG. 10 occludes only 0.8% of the area of the transparent conductive region.

Figure 36:

The overlaid micropattern is illustrated in FIG. 36. The contrast threshold at a distance of 30000 units (with pixel size of 0.265) of Comparative Example A was determined to be −41.4.

Example B

Figure 13:
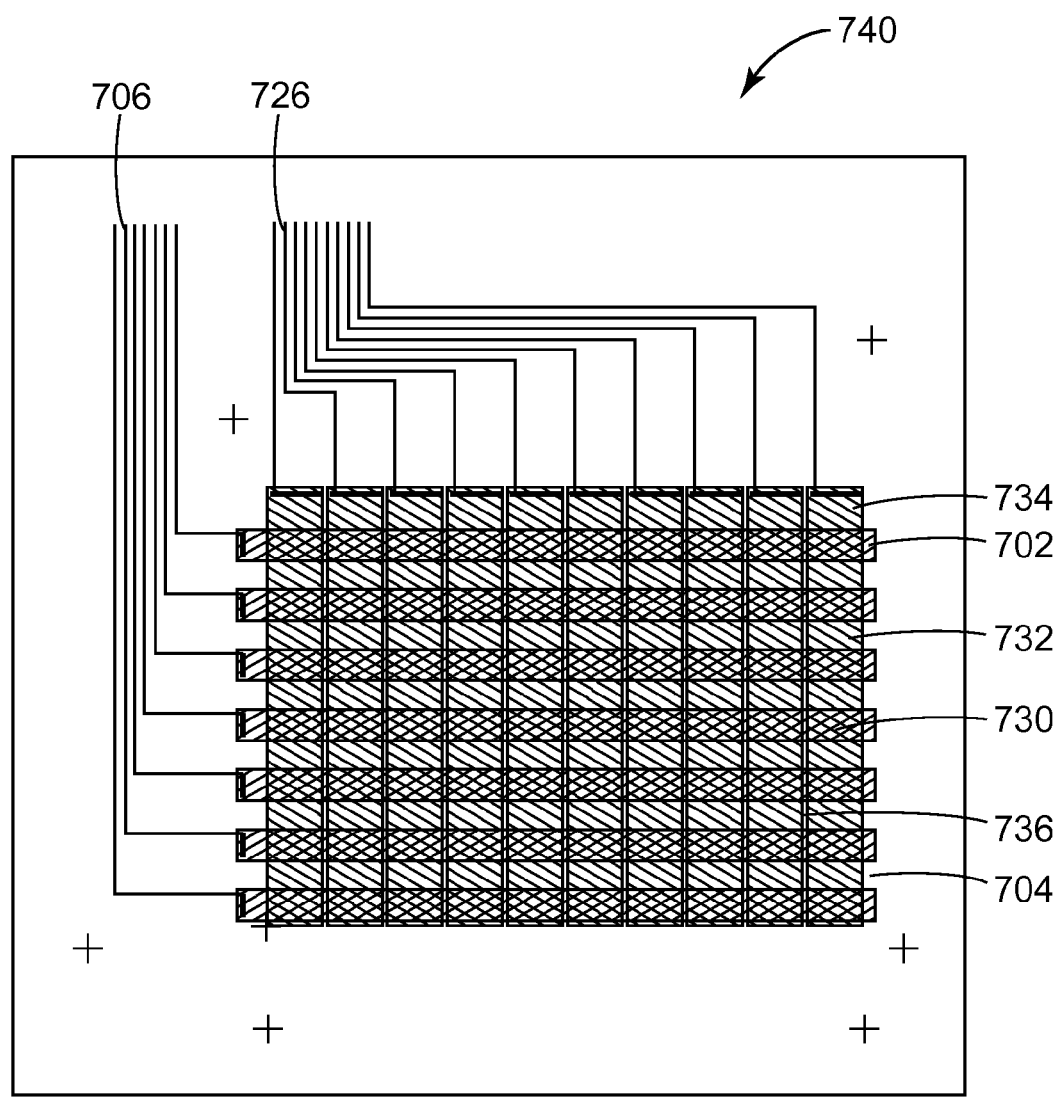
FIG. 13 illustrates a projected capacitive touch screen transparent sensor element constructed from overlaying the first and second patterned substrates of FIGS. 11 and 12.

A transparent sensor element was fabricated and combined with a touch sensor drive device as generally shown in FIGS. 11, 12 and 13 using microcontact printing and etching as described in co-assigned U.S. Provisional application 61/032,273, filed Feb. 28, 2008. The device was then integrated with a computer processing unit connected to a display to test the device. The device was able to detect the positions of multiple single and or simultaneous finger touches, which was evidenced graphically on the display. This example used micro-contact printing and etching techniques (see also copending U.S. Patent App. No. 61/032,273, filed Feb. 28, 2008) to form the micro-conductor pattern used in the touch sensor.

Formation of a Transparent Sensor Element

First Patterned Substrate

A first visible light substrate made of polyethylene terephthalate (PET) having a thickness of 125 micrometers (μm) was vapor coated with 100 nm silver thin film using a thermal evaporative coater to yield a first silver metalized film. The PET was commercially available as product number ST504 from E.I. du Pont de Nemours, Wilmington, Del. The silver was commercially available from Cerac Inc., Milwaukee, Wis. as 99.99% pure 3 mm shot.

A first poly(dimethylsiloxane) stamp, referred to as PDMS and commercially available as product number Sylgard 184, Dow Chemical Co., Midland, Mich., having a thickness of 3 mm, was molded against a 10 cm diameter silicon wafer (sometimes referred to in the industry as a "master") that had previously been patterned using standard photolithography techniques. The PDMS was cured on the silicon wafer at 65° C. for 2 hours. Thereafter, the PDMS was peeled away from the wafer to yield a first stamp having two different low-density regions with patterns of raised features, a first continuous hexagonal mesh pattern and a second discontinuous hexagonal mesh pattern. That is, the raised features define the edges of edge-sharing hexagons. A discontinuous hexagon is one that contains selective breaks in a line segment. The selective breaks had a length less than 10 μm. The breaks were designed and estimated to be approximately 5 μm. In order to reduce their visibility, it found that, preferably, the breaks should be less than 10 μm, more preferably, 5 μm or less, e.g., between 1 and 5 μm. Each raised hexagon outline pattern had a height of 2 μm, had 1% to 3% area coverage, corresponding to 97% to 99% open area, and line segments that measured from 2 to 3 μm in width. The first stamp also included raised features defining 500 μm wide traces. The first stamp has a first structured side that has the hexagonal mesh pattern regions and the traces and an opposing second substantially flat side.

The stamp was placed, structured side up, in a glass Petri dish containing 2 mm diameter glass beads. Thus, the second, substantially flat side was in direct contact with the glass beads. The beads served to lift the stamp away from the base of the dish, allowing the following ink solution to contact essentially all of the flat side of the stamp. A 10 millimolar ink solution of 1-octadecanethiol (product number C18H3CS, 97%, commercially available from TCI America, Portland Oreg.) in ethanol was pipetted into the Petri dish beneath the stamp. The ink solution was in direct contact with the second substantially flat side of the stamp. After sufficient inking time (e.g., 3 hours) where the ink has diffused into the stamp, the first stamp was removed from the petri dish. The inked stamp was placed, structured side up, onto a working surface. The first silver metalized film was applied using a hand-held roller onto the now inked structured surface of the stamp such that the silver film was in direct contact with the structured surface. The metalized film remained on the inked stamp for 15 seconds. Then the first metalized film was removed from the inked stamp. The removed film was placed for three minutes into a silver etchant solution, which contained (i) 0.030 molar thiourea (product number T8656, Sigma-Aldrich, St. Louis, Mo.) and (ii) 0.020 molar ferric nitrate (product number 216828, Sigma-Aldrich) in deionized water. After the etching step, the resulting first substrate was rinsed with deionized water and dried with nitrogen gas to yield a first patterned surface. Where the inked stamp made contact with the silver of the first metalized substrate, the silver remained after etching. Thus silver was removed from the locations where contact was not made between the inked stamp and silver film.

FIGS. 11, 11a and 11b show a first patterned substrate 700 having a plurality of first continuous regions 702 alternating between a plurality of first discontinuous regions 704 on a first side of the substrate, which is the side that contained the now etched and patterned silver metalized film. The substrate has an opposing second side that is substantially bare PET film. Each of the first regions 702 has a corresponding 500 μm wide conductive trace 706 disposed at one end. FIG. 11a shows an exploded view of the first region 702 having a plurality of continuous lines forming a hexagonal mesh structure. FIG. 11b shows an exploded view of the first discontinuous region 704 having a plurality of discontinuous lines (shown as selective breaks in each hexagon) forming a discontinuous hexagonal mesh structure. Each mesh structure of regions 702 and 704 had 97% to 99% open area. Each line segment measured from 2 to 3 µm.

Second Patterned Substrate

The second patterned substrate was made as the first patterned substrate using a second visible light substrate to produce a second silver metalized film. A second stamp was produced having a second continuous hexagonal mesh pattern interposed between a second discontinuous hexagonal mesh pattern.

FIGS. 12, 12*a* and 12*b* show a second patterned substrate 720 having a plurality of second continuous regions 722 alternating between a plurality of second discontinuous regions 724 on a first side of the second substrate. Each of the second regions 722 has a corresponding 500 µm wide second conductive trace 726 disposed at one end. FIG. 12*a* shows an exploded view of one second region 722 having a plurality of continuous lines forming a hexagonal mesh structure. FIG. 12*b* shows an exploded view of one second discontinuous region 724 having a plurality of discontinuous lines (shown as selective breaks in each hexagon) forming discontinuous hexagonal mesh structure. The selective breaks had a length less than 10 µm. The breaks were designed and estimated to be approximately 5 µm. In order to reduce their visibility, it found that, preferably, the breaks should be less than 10 µm, more preferably, 5 µm or less, e.g., between 1 and 5 µm. Each mesh structure of region 722 and 724 had 97% to 99% open area. Each line segment measured from 2 to 3 µm.

Further with respect to the geometries, orientations, and cell dimensions of the mesh designs of the first and second patterned substrates, the first patterned substrate comprised hexagonal cells with diameter of 300 micrometers and the second pattern substrate comprised hexagonal cells with diameter of 200 micrometers. One of the conductor micropatterns had a cell dimension of 1.5 times the cell dimension of the second conductor micropattern. In the sensor element described below, as formed in part by the combination of the two patterned substrates, there was a relative orientation or bias angle between the hexagonal meshes of 30 degrees. The bias angle between the two conductor micropatterns was 0.5 times the repeat angle of 60 degrees for a hexagonal mesh.

Formation of a Projected Capactive Touch Screen Sensor Element

The first and second patterned substrates made above were used to produce a two-layer projected capacitive touch screen transparent sensor element as follows.

The first and second patterned substrates were adhered together using Optically Clear Laminating Adhesive 8141 from 3M Company, St. Paul, Minn. to yield a multilayer construction. A handheld roller was used to laminate the two patterned substrates with the regions of the first and second conductive trace regions 706 and 726 being adhesive free. The multilayer construction was laminated to a 0.7 mm thick float glass using Optically Clear Laminating Adhesive 8141 such that the first side of the first substrate was proximate to the float glass. The adhesive free first and second conductive trace regions 706 and 726 allowed electrical connection to be made to the first and second patterned substrates 700 and 720.

FIG. 13 shows a top plan view of a multilayer touch screen sensor element 740 where the first and second patterned substrate have been laminated. Region 730 represented the overlap of the first and second continuous regions. Region 732 represented the overlap of the first continuous region and the second discontinuous region. Region 734 represented the overlap of the second continuous region and the first discontinuous region. And, region 736 represented the overlap between the first and second discontinuous regions. While there was a plurality of these overlap regions, for ease of illustration, only one region of each has been depicted in the figure.

The integrated circuits used to make mutual capacitance measurements of the transparent sensor element were PIC18F87J10 (Microchip Technology, Chandler, Ariz.), AD7142 (Analog Devices, Norwood, Mass.), and MM74HC154WM (Fairchild Semiconductor, South Portland, Me.). The PIC18F87J10 was the microcontroller for the system. It controlled the selection of sensor bars which MM74HC154WM drives. It also configured the AD7142 to make the appropriate measurements. Use of the system included setting a number of calibration values, as is known in the art. These calibration values can vary from touch screen to touch screen. The system could drive 16 different bars and the AD7142 can measure 12 different bars. The configuration of the AD7142 included selection of the number of channels to convert, how accurately or quickly to take measurements, if an offset in capacitance should be applied, and the connections for the analog to digital converter. The measurement from the AD7142 was a 16 bit value representing the capacitance of the cross point between conductive bars in the matrix of the transparent sensor element.

After the AD7142 completed its measurements it signaled the microcontroller, via an interrupt, to tell it to collect the data. The microcontroller then collected the data over the SPI port. After the data was received, the microcontroller incremented the MM74HC154WM to the next drive line and cleared the interrupt in the AD7142 signaling it to take the next set of data. While the sampling from above was constantly running, the microcontroller was also sending the data to a computer with monitor via a serial interface. This serial interface allowed a simple computer program, as are known to those of skill in the art, to render the raw data from the AD7142 and see how the values were changing between a touch and no touch. The computer program rendered different color across the display, depending on the value of the 16 bit value. When the 16 bit value was below a certain value, based on the calibration, the display region was rendered white. Above that threshold, based on the calibration, the display region was rendered green. The data were sent asynchronously in the format of a 4 byte header (0xAAAAAAAA), one byte channel (0x00–0x0F), 24 bytes of data (represents the capacitive measurements), and carriage return (0x0D).

Results of Testing of the System

The transparent sensor element was connected to the touch sensor drive device.

When a finger touch was made to the glass surface, the computer monitor rendered the position of touch that was occurring within the touch sensing region in the form of a color change (white to green) in the corresponding location of the monitor. When two finger touches were made simultaneously to the glass surface, the computer monitor rendered the positions of touches that were occurring within the touch sensing region in the form of a color change (white to green) in the corresponding locations of the monitor. When three finger touches were made simultaneously to the glass surface, the computer monitor rendered the positions of touches that were occurring within the touch sensing region in the form of a color change (white to green) in the corresponding locations of the monitor.

Preparation of Additional Two-Layer Meshes

Samples of microcontact printed meshes were prepared as described in U.S. Provisional Application Ser. No. 61/221, 888, filed Jun. 30, 2009.

Two-layer mesh samples were prepared as follows: single layers of micropatterned meshes approximately 1.7 cm×1.7 cm were laminated to each other using 3M Optically Clear Adhesive 8271 (3M Company, Maplewood, Minn.), one layer being rotated a specified number of degrees from the other layer, and the centers of both layers being located over one another (the specifics of each overly arrangement is further described in the following table). The two-layer construction was then laminated to the center of a 2 inch×3 inch×1 mm glass microscope slide using the same optically clear adhesive. The silver patterned side of each layer faced the glass slide. Seven two-layer mesh samples were prepared for visibility studies, as well as two "blank" samples constructed in the same way as the mesh samples, but using unpatterned 5 mil PET (ST504, E. I. DuPont de Nemours and Company, Wilmington, Del.) for each of the two layers. The sample set prepared for visibility testing is shown below.

Visibility of Overlaid Micropatterned Substrates as Determined with Test Panel

A viewing device was constructed in which a participant ("viewer") was seated in front of a viewing port. Behind the viewing port and contained within an enclosure was a light source and a sample holder. A single sample was mounted in a black sample holder positioned approximately 25 cm below the light source (30 watt bulb) and tilted towards the viewer at an approximately 7 deg angle. The sample holder masked the microscope slide except for a 1.4 cm ×1.4 cm square aperture through which the two-layer samples could be seen by the viewer. Hence, the sample size viewed by the test panel covered a larger surface area than the sample size used for determining the contrast threshold. The sample holder was inserted into an aperatured stage within a chamber. The viewing distance between the sample and the viewer's eyes was 280 mm to 320 mm. The chamber was darkened on the other side of the aperture allowing the viewer to look through the layers of the mesh pattern, the mounting glass, and into the darkened viewing box beyond—so as to simulate looking at the surface of a display with the backlighting illumination turned off with ambient light reflecting off the surface of the display. The light source was connected to a Powerstat® Variable Autotransformer (Type 3PN116C, 120 V in, 0-140 V out, 10Å, The Superior Electric Company, Bristol, Connecticut) which allowed viewers to adjust the amount of light illuminating the sample.

The *Method of Adjustment* paradigm (*Psychophysics: The fundamentals*, Gescheider, G. A., Lawrence Erlbaum Associates, Inc. Mahwah, N.J. (1997)) was used to measure visibility of the samples as follows: The room lights were turned off. A sample was placed in the aperture of the sample holder and inserted into the viewing device. The viewer placed their head in the viewing port such that they could see the sample, but direct reflection of the light bulb was not visible. The viewer was instructed to begin with the light source dark (variable autotransformer dial set at 0) and increase the amount of light by turning the dial until the pattern of the sample was just barely able to be seen (Test Method A). Some viewers were told to begin with the light source at full strength (variable autotransformer dial set at 140) and decrease the amount of light until the pattern of the sample is just barely able to be seen (Test Method B). Test Method A was used for half of the total number of measurements made by each viewer, and Test Method B was used for the other half of the total number of measurements made by each viewer. Each of the samples were measured twice per viewer using test Method A and twice per viewer using Test Method B. A mean value was then calculated for each viewer. For half of the viewers, Method A was used first for each of the samples followed by Method B; whereas for the other half of the viewers Method B was used first and then Method A. The sample order was randomized. Viewers were instructed that they may not be able to see a pattern on one or several samples, or may be able to see a pattern in all samples. The number corresponding to the position of the variable autotransformer dial at which point the viewer was able to just barely see the pattern of a sample was the value recorded for the purpose of ranking the apparent visibilities. For each sample, a mean value was then calculated based on all the mean values of the viewers. Statistical outliers (i.e. more than 3 standard deviations) were omitted.

The rank order of the visibilities of the two-layer samples was compared to the predicted rank order as calculated by the model. The comparison of rank order is shown below.

TABLE 1

Figure 7:
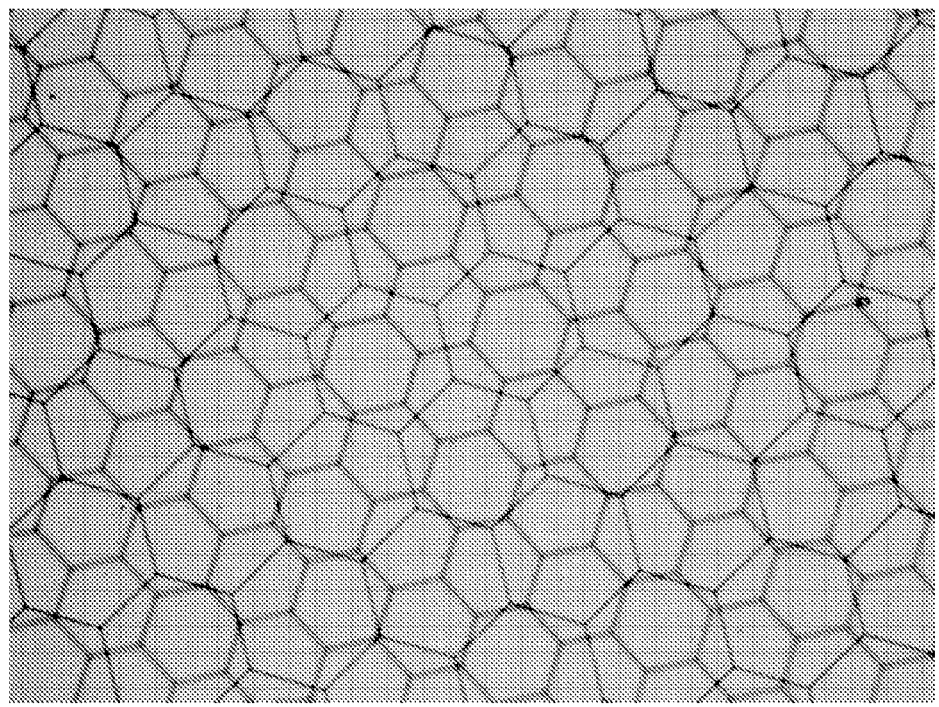
FIG. 7 is an optical photomicrograph (transmission illumination) of Sample 5 depicting two overlaid layers of a regular hexagonal metallic mesh wherein one micropattern has a cell diameter of 200 micrometers, the other micropattern has a cell diameter of 300 micrometers, and the hexagonal meshes are rotated by an angle of 27 degrees with respect to each other (i.e. the bias angle equals 27 degrees)
Figure 14:
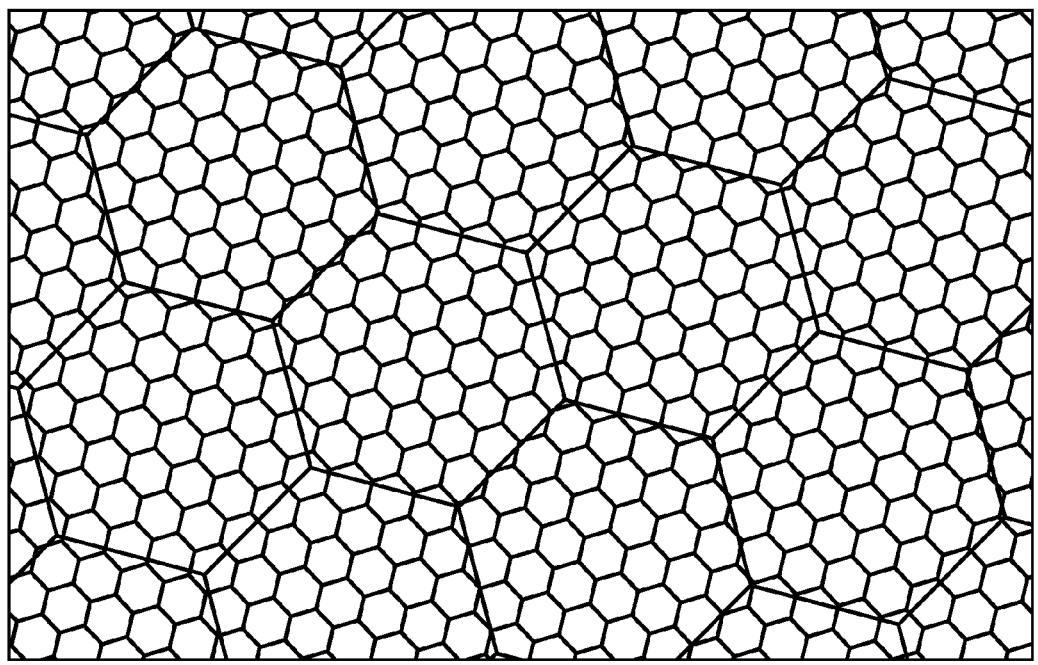
Figure 15:
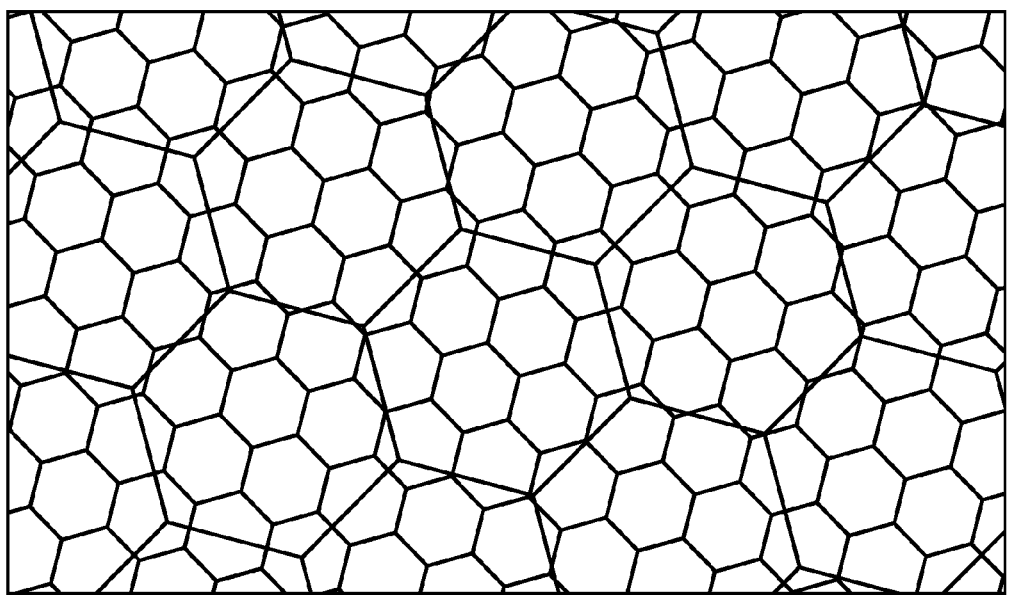
Figure 16:
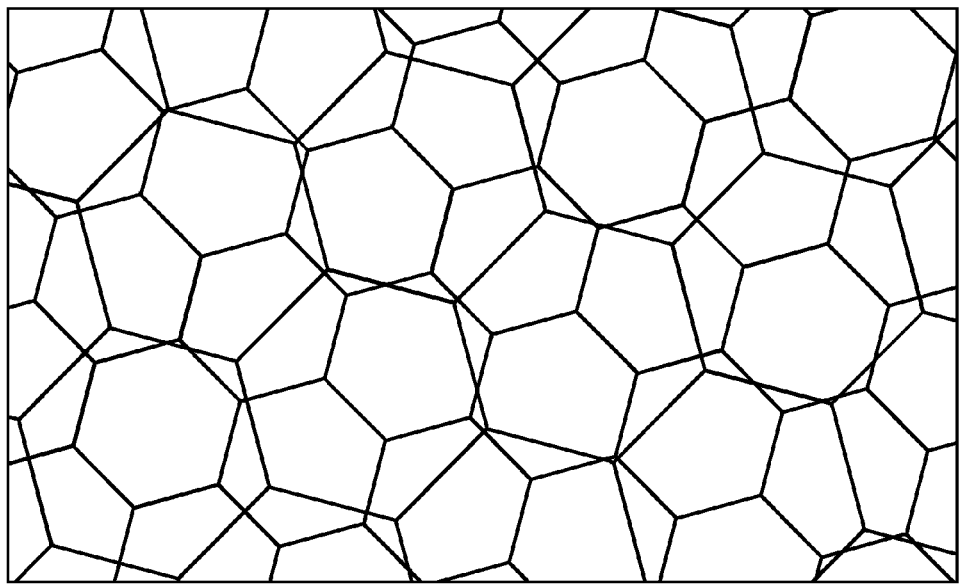
Figure 17:
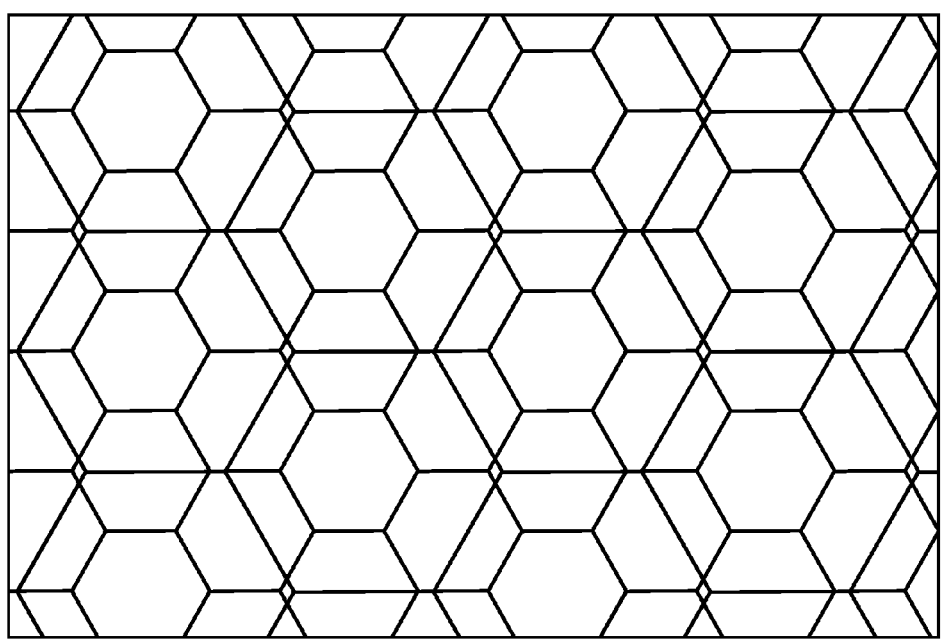

| Overlaid Micropattern Sample | First Conductive Micropattern | | Second Conductive Micropattern | | Cell Dimension Ratio | Bias Angle (deg) |
|---|---|---|---|---|---|---|
| | Cell Dimension* (microns) | Trace (i.e. line) Width (microns) | Cell Dimension* (microns) | Trace (i.e. line) Width (microns) | | |
| 1 (FIG. 14) | 100 | 2 | 600 | 2 | 6 | 30 |
| 2 (FIG. 15) | 200 | 2 | 600 | 2 | 3 | 30 |
| 3 (FIG. 16) | 400 | 2 | 600 | 2 | 1.5 | 30 |
| 4 (FIG. 17) | 300 | 2 | 600 | 2 | 2 | 0 |
| 5** (FIG. 7) Example B | 200 | 2 | 300 | 2 | 1.5 | 30 |
| 6 (FIG. 18) | 100 | 2 | 100 | 2 | 1 | 30 |
| 7 (FIG. 19) | 600 | 2 | 600 | 2 | 1 | 30 |
| 8 Control A | blank | NA | blank | NA | NA | 30 |
| 9 Control B | blank | NA | blank | NA | NA | 30 |

*Hex face-to-face distance
**It was found that the overlaid micropattern of Example 5 (FIG. 7) had a bias angle of 27 degrees.

TABLE 2

| Contrast Thresholds at Distance 30000 units (with pixel size of .265 mm) | Sample Order as Determined by Model | Sample Order as Determined by Test Panel | Visibility |
|---|---|---|---|
| −35.2 | 7 | 7 | Most visible |
| −31.7 | 3 | 3 | \| |
| −26.1 | 4 | 2 | \| |
| −29.0 | 2 | 4 | \| |
| −21.0 | 1 | 1 | ↓ |

TABLE 2-continued

| Contrast Thresholds at Distance 30000 units (with pixel size of .265 mm) | Sample Order as Determined by Model | Sample Order as Determined by Test Panel | Visibility |
|---|---|---|---|
| −17.0 (30° bias angle) | 5 | 5 | Least visible |
| −17.0 (27° bias angle) | | | |
| 1.7 | 6 | 6 | Not visible |
| N/A | 8 | 8 | Not visible - Control A (no micropattern) |
| N/A | 9 | 9 | Not visible - Control B (no micropattern) |

In the case of CAD generated overlaid micropatterns and those that would be produced in manufacture, the micropatterns can be overlaid precisely resulting in a regular net pattern. However, when the micropatterns are overlaid by hand, a small degree of positioning error can occur (1-2 degrees). When the patterns are overlaid at an angle, such as in the case of Example 5, such positioning error does not significantly affect the calculated contrast thresholds. However, when the patterns are overlaid by hand at a bias angle of 0, such small positioning errors can result in an irregular pattern. Since the contrast threshold was calculated on only a portion of the pattern, it may not be representative of the entire pattern, as was viewed by the test panel. This is believed to be the cause of the discrepancy between the sample order as determined by the model and the sample order as determined by the test panel in connection with Sample 4.

Overlaid micropattern Samples 10-25 were digitally designed.

TABLE 3a

First Conductive Micropattern

| Sample | Cell Dimension* (microns) | Trace (i.e. line) Width (microns) | Cell Geometry |
|---|---|---|---|
| 10 | 105 | 5 | Square |
| 11 | 105 | 5 | Square |
| 12 | 105 | 5 | Square |
| 13 | 105 | 5 | Square |
| 14 | 300 | 5 | Hexagon |
| 15 | 300 | 5 | Hexagon |
| 16 | 300 | 5 | Hexagon |
| 17 | 600 | 3 | Hexagon |
| 18 | 600 | 3 | Hexagon |
| 19 | 600 | 3 | Hexagon |
| 20 | 300 | 3 | Hexagon |
| 21 | 200 | 3 | Hexagon |
| 22 | 300 | 3 | Hexagon |
| 23 | 133 | 2 | Hexagon |
| 24 | 600 | 3 | Hexagon |
| 25 | 200 | 2 | Hexagon |

*Hex face-to-face distance or square edge length

TABLE 3b

Second Conductive Micropattern

| Sample | Cell Dimension* (microns) | Trace (i.e.) Line Width (microns) | Cell Geometry | Cell Dimension Ratio |
|---|---|---|---|---|
| 10 | 105 | 5 | Square | 1 |
| 11 | 105 | 5 | Square | 1 |
| 12 | 105 | 5 | Square | 1 |
| 13 | 105 | 5 | Square | 1 |
| 14 | 300 | 5 | Hexagon | 1 |
| 15 | 300 | 5 | Hexagon | 1 |
| 16 | 300 | 5 | Hexagon | 1 |
| 17 | 600 | 3 | Hexagon | 1 |
| 18 | 600 | 3 | Hexagon | 1 |
| 19 | 600 | 3 | Hexagon | 1 |
| 20 | 50 | 3 | Square | 6 |
| 21 | 80 | 3 | Square | 2.5 |
| 22 | 160 | 3 | Square | 1.875 |
| 23 | 133 | 2 | Hexagon | 1 |
| 24 | 600 | 3 | Hexagon | 1 |
| 25 | 300 | 2 | Hexagon | 1.5 |

Figure 20:
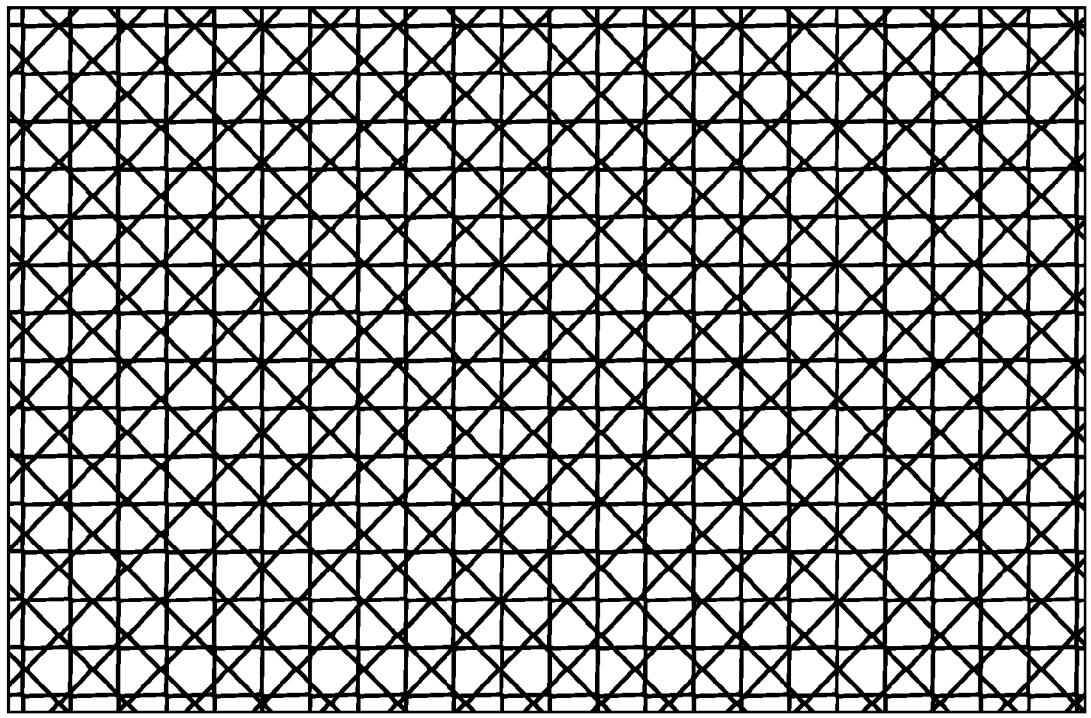
Figure 21:
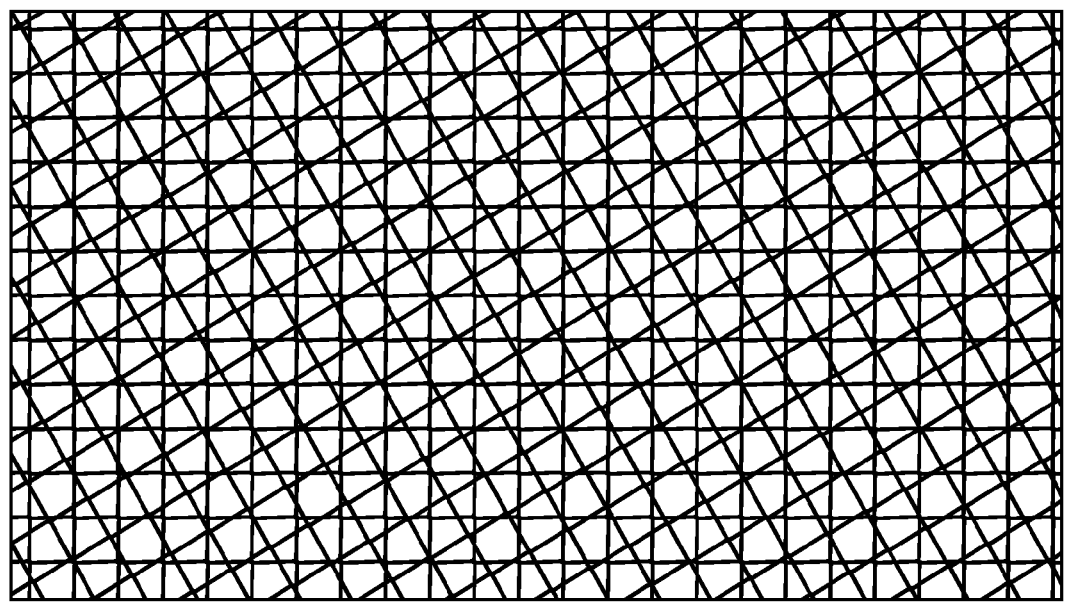
Figure 28:
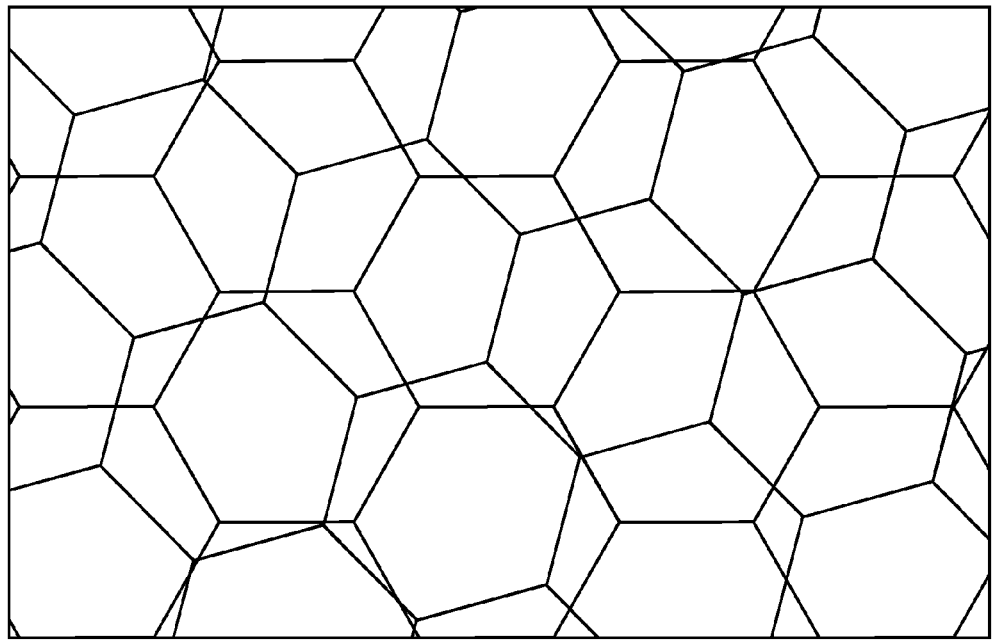
Figure 29:
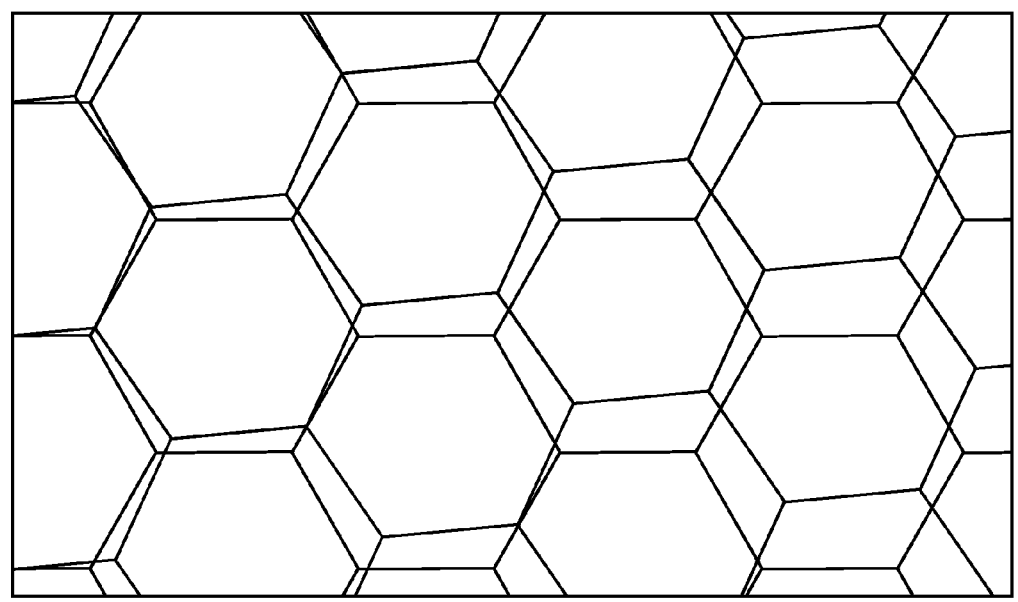
Figure 30:
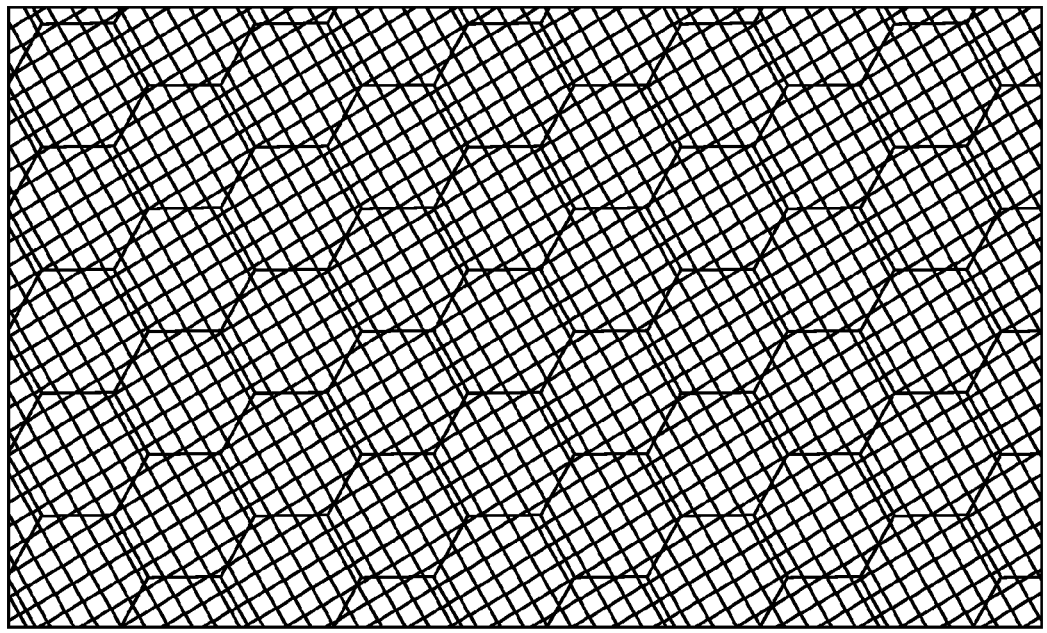
Figure 31:
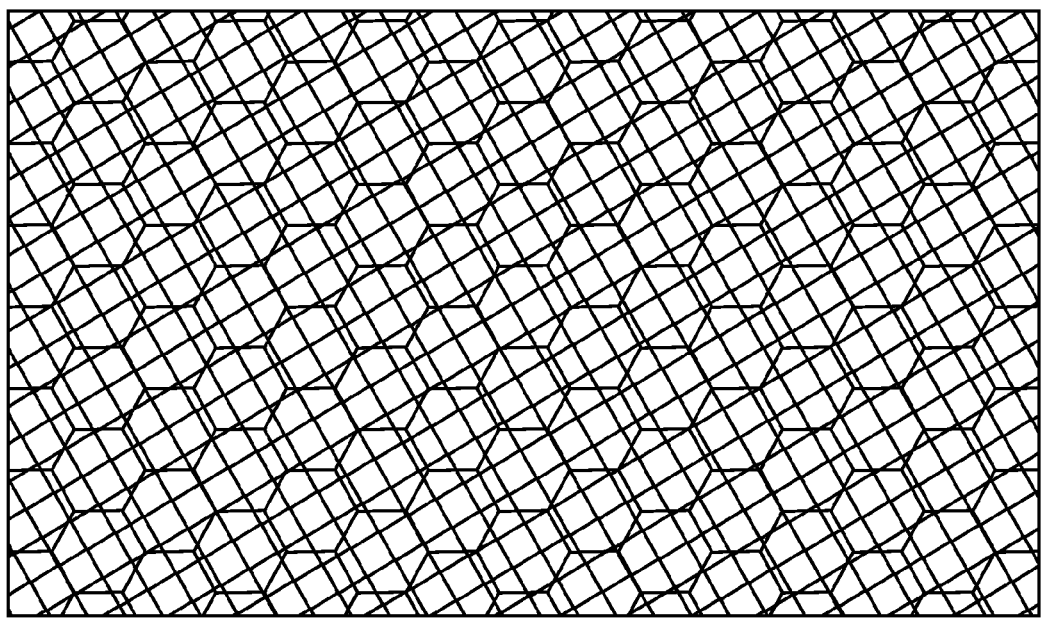
Figure 32:
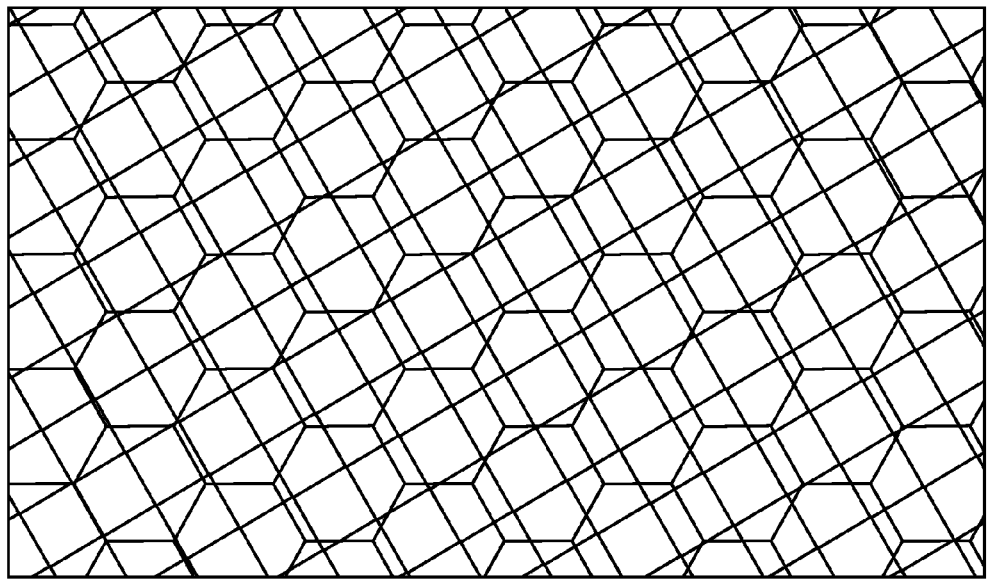
Figure 33:
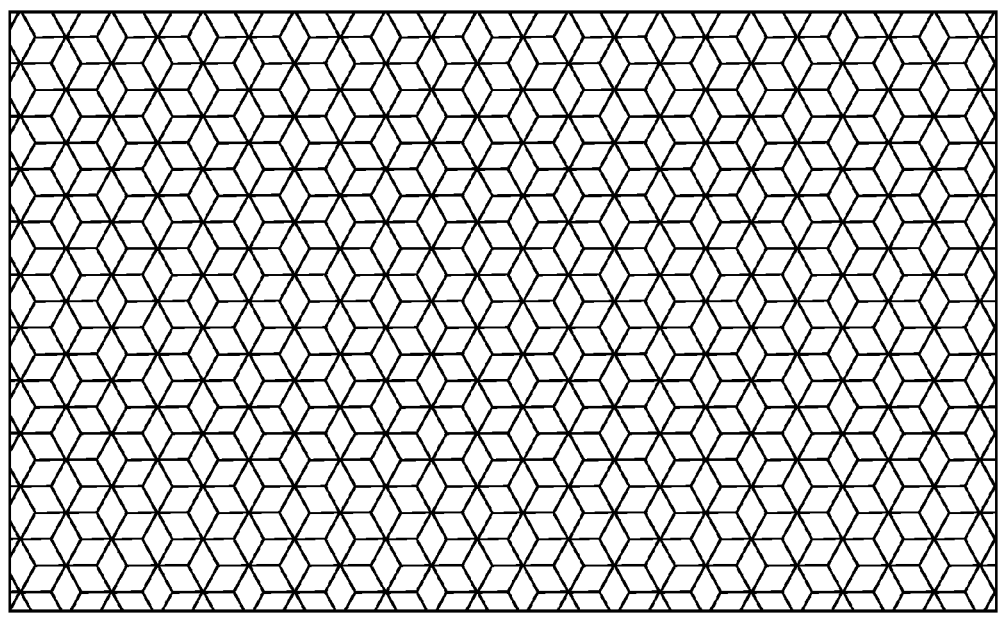
Figure 34:
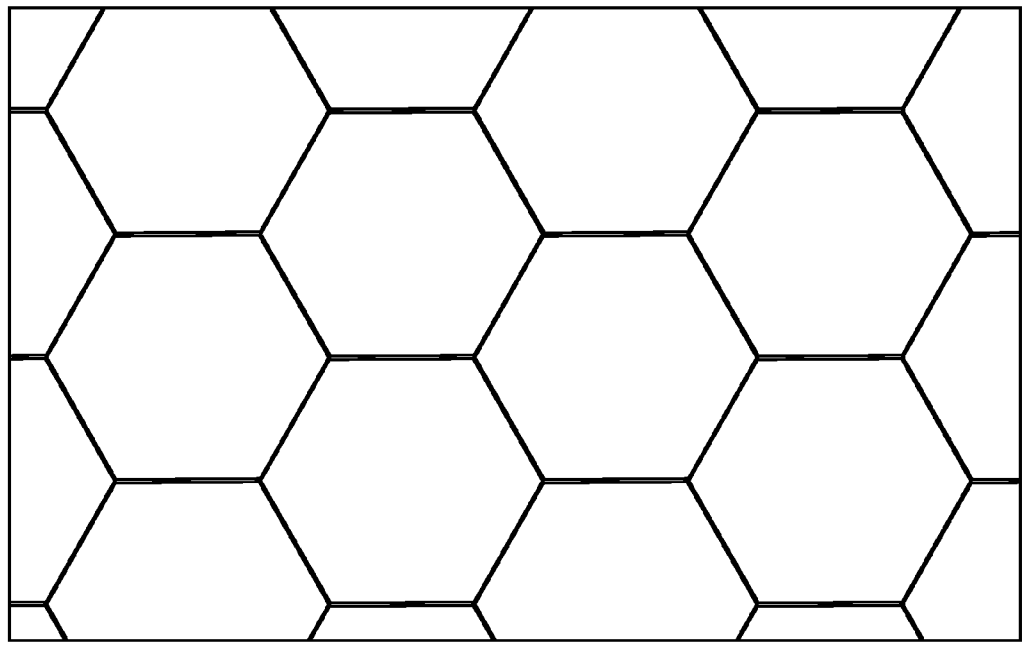
Figure 35:
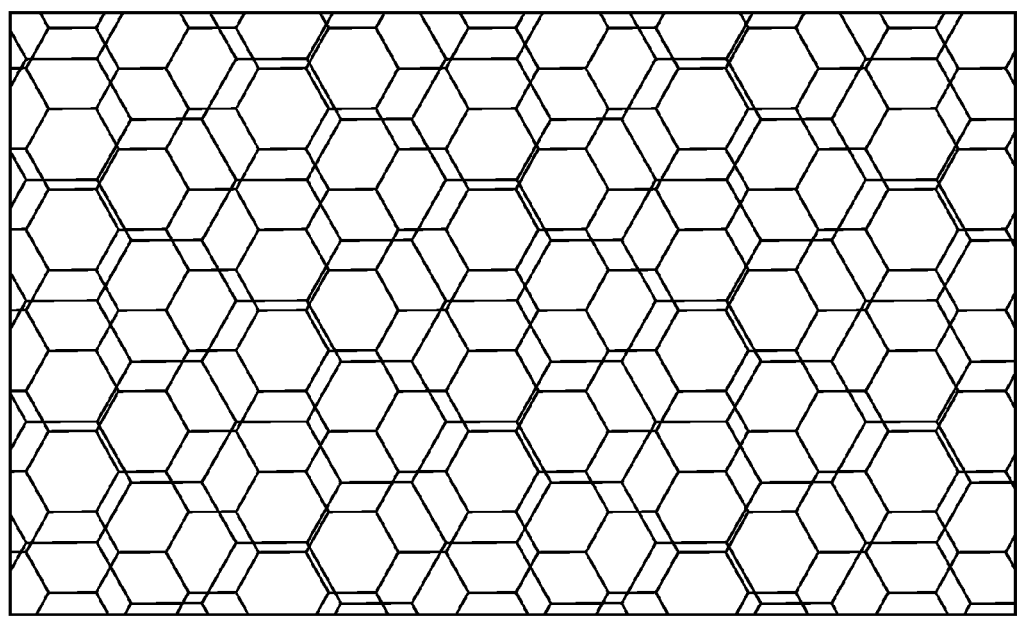

| Sample of Table 3a Overlaid with Sample of Table 3b | Bias Angle (deg) | Illustration | Contrast Thresholds |
|---|---|---|---|
| 10 | 45 | FIG. 20 | −11.3 |
| 11 | 30 | FIG. 21 | −10.9 |
| 12 | 15 | FIG. 22 | −11.5 |
| 13 | 5 | FIG. 23 | −16.5 |
| 14 | 45 | FIG. 24 | −22.7 |
| 15 | 15 | FIG. 25 | −22.4 |
| 16 | 5 | FIG. 26 | −22.4 |
| 17 | 45 | FIG. 27 | −35.3 |
| 18 | 15 | FIG. 28 | −35.1 |
| 19 | 5 | FIG. 29 | −34.4 |
| 20 | 30 | FIG. 30 | Infinite (i.e., uniform appearance) |
| 21 | 30 | FIG. 31 | −8.5 |
| 22 | 30 | FIG. 32 | −17.4 |
| 23 | 0 | FIG. 33 | −3.9 |
| 24 | 0 | FIG. 34 | −38.2 |
| 25 | 0 | FIG. 35 | −17.7 |

What is claimed is:

1. A touch screen sensor, comprising: a visible light transparent substrate; and
    at least two overlaid conductive mesh micropatterns with two dimensional contiguous meshes comprising:
    a first conductive mesh micropattern comprising linear traces defining a first open mesh of a repeating cell geometry disposed on or in the visible light transparent substrate, and
    a second conductive mesh micropattern comprising linear traces defining a second open mesh of a repeating cell geometry electrically isolated from the first conductive mesh micropattern oriented at a bias angle such that at least a portion of the linear traces of the second conductive mesh micropattern are non-parallel to the linear traces of the first conductive mesh micropattern; and
    wherein the second conductive mesh micropattern overlays the first conductive mesh micropattern such that at least a portion of the second conductive mesh micropattern has a different cell geometry from the cell geometry of the first conductive mesh micropattern; or
    at least a portion of the second conductive mesh micropattern has a different cell dimension from the cell dimension of the first conductive mesh micropattern; or a combination thereof.

2. The touch screen sensor of claim 1 wherein at least a portion of the linear traces of the second conductive micropattern are non-parallel to the linear traces of first conductive micropattern.

3. The touch screen sensor of claim 1 wherein at least a portion of the second conductive micropattern has a different cell dimension from the cell dimension of the first conductive micropattern.

4. The touch screen sensor of claim 1 wherein the first and second conductive micropatterns have the same cell geometry.

5. The touch screen sensor of claim 1 wherein the first and second conductive micropatterns each comprise a regular cell geometry.

6. The touch screen sensor of claim 1 wherein the first and second conductive micropatterns comprise a hexagonal cell geometry.

7. The touch screen sensor of claim 4 wherein the second micropattern is orientated at a bias angle ranging from 15 degrees to 40 degrees relative to the first micropattern.

8. The touch screen sensor of claim 1 wherein the linear traces have a line width of less than 5 microns.

9. The touch screen sensor of claim 1 wherein the cell geometry of the first and second micropatterns has an average cell width of no greater than 500 microns.

10. The touch screen sensor of claim 1 wherein the first micropattern has a regular hexagonal cell geometry and the second micropattern has a regular hexagonal cell geometry;
   a ratio of the cell dimension of the first micropattern to the cell dimension of the second micropattern is between 1.2 to 3; and
   a bias angle between the first micropattern and the second micropattern is between 10 and 45 degrees.

11. The touch screen sensor of claim 4 wherein at least a portion of the linear traces of the second conductive micropattern are non-parallel to the linear traces of the first conductive micropattern and there is a bias angle between the first conductive micropattern and second conductive micropattern of between 0.1 and 0.9 times a repeat angle.

12. The touch screen sensor of claim 4 wherein the cell dimension of the first conductive micropattern is between 1.1 and 6 times the cell dimension of the second conductive micropattern, and there is a bias angle between the patterns of between 0.1 and 0.9 times a repeat angle.

13. The touch screen sensor of claim 1 wherein the combination of electrically conductive mesh micropatterns has a contrast threshold at a distance of 30000 foveal detection model distance units of greater than −35 decibels.

14. The touch screen sensor of claim 13 wherein the mesh micropatterns have a pattern density of less than 20%.

15. The touch screen sensor of claim 13 wherein the cell geometry of the first and second mesh micropatterns has an average cell width of no greater than 500 microns.

16. An electrically conductive article comprising: a visible light transparent substrate; and at least two overlaid conductive mesh micropatterns with two dimensional contiguous meshes comprising: a first conductive mesh micropattern comprising linear traces defining a first open mesh of a repeating cell geometry disposed on or in the visible light transparent substrate, and
   a second conductive mesh micropattern comprising linear traces defining a second open mesh of a repeating cell geometry electrically isolated from the first conductive mesh micropattern; and
   wherein the second conductive mesh micropattern overlays the first conductive mesh micropattern such that
   i) at least a portion of the linear traces of the second conductive mesh micropattern are non-parallel to the linear traces of first conductive mesh micropattern and oriented at a bias angle; and
   ii) at least a portion of the second conductive mesh micropattern has a different cell geometry than the first conductive mesh micropattern; or iii) at least a portion of the second conductive mesh micropattern has a different cell dimension than the first conductive mesh micropattern; or a combination thereof.

17. The article of claim 16 wherein the first or second micropattern functions as an antenna or electromagnetic interference (EMI) shield.

* * * * *

UNITED STATES PATENT AND TRADEMARK OFFICE
CERTIFICATE OF CORRECTION

PATENT NO. : 8,970,515 B2
APPLICATION NO. : 13/148369
DATED : March 3, 2015
INVENTOR(S) : Cristin Moran et al.

It is certified that error appears in the above-identified patent and that said Letters Patent is hereby corrected as shown below:

In the Specification

Column 3,
Line 9, delete "P-layer" and insert -- Y-layer --, therefor.

Signed and Sealed this
Fourteenth Day of July, 2015

Michelle K. Lee
*Director of the United States Patent and Trademark Office*